(12) United States Patent
Potter et al.

(10) Patent No.: US 6,268,746 B1
(45) Date of Patent: *Jul. 31, 2001

(54) METHOD AND APPARATUS FOR LOGIC SYNCHRONIZATION

(75) Inventors: Terence M. Potter; James S. Blomgren; Anthony M. Petro; Stephen C. Horne, all of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/586,638

(22) Filed: Jun. 5, 2000

Related U.S. Application Data

(63) Continuation of application No. 09/179,330, filed on Oct. 27, 1998, now Pat. No. 6,118,304.
(60) Provisional application No. 60/069,250, filed on Dec. 11, 1997, provisional application No. 60/066,498, filed on Nov. 24, 1997, and provisional application No. 60/067,073, filed on Nov. 20, 1997.

(51) Int. Cl.[7] .......................... H03K 19/096; H03K 19/00
(52) U.S. Cl. .................................. 326/93; 326/96
(58) Field of Search .................. 326/93, 96, 97, 326/98; 327/144, 233, 295

(56) References Cited

U.S. PATENT DOCUMENTS

| | | |
|---|---|---|
| 5,434,520 | 7/1995 | Yetter et al. . |
| 5,517,136 | 5/1996 | Harris et al. . |
| 5,760,610 | 6/1998 | Naffziger . |
| 5,880,609 * | 3/1999 | Klass et al. ............................. 326/93 |
| 5,886,540 | 3/1999 | Perez . |
| 5,917,331 | 6/1999 | Persons . |
| 5,983,013 * | 11/1999 | Rogers et al. .......................... 326/96 |
| 6,018,254 * | 1/2000 | Rogers et al. .......................... 326/96 |

OTHER PUBLICATIONS

Harris, Skew–Tolerant Domino Circuits, IEEE Journal of Solid–State Circuits, 11/97, 1702–1711, vol. 32, No. 11.

* cited by examiner

Primary Examiner—Michael Tokar
Assistant Examiner—Daniel D. Chang
(74) Attorney, Agent, or Firm—Booth & Wright, L.L.P.; Matthew J. Booth

(57) ABSTRACT

The present invention is a method and apparatus that synchronizes logic in an integrated circuit (IC). The present invention discloses a global clock signal with a global phase and an approximately 50% duty cycle. Additionally, the present invention discloses a first local clock signal with a first phase and an approximately 50% duty cycle that couples to a first dynamic logic gate where the first local clock signal is generated from the global clock signal. One or more intermediate local clock signals with one or more intermediate phases are generated from the global clock signal where each intermediate local clock signal has an approximately 50% duty cycle that couples to one or more intermediate dynamic logic gates. An end local clock signal with an end phase and an approximately 50% dutycycle that is also generated from the global clock signal and that couples to an end dynamic logic gate. The phase of an individual local clock signal overlaps an earlier phase local clock signal by an amount approximately equal to the overlap of the phase of the next individual local clock signal. The first dynamic logic gate, the intermediate dynamic logic gate(s), and the last dynamic logic gates couple such that an individual dynamic logic gate with an individual local clock signal and phase may only provide a signal to the next individual dynamic logic gate that uses a next phase local clock signal where the gates may couple together in series, in a feed back loop, or a feed forward loop.

16 Claims, 20 Drawing Sheets

METHOD AND APPARATUS FOR LOGIC SYNCHRONIZATION

This application claims the benefits of the earlier filed U.S. Provisional App. Ser. No. 60/069,250, filed Dec. 11, 1997 (11.12.1997), which is incorporated by reference for all purposes into this specification. Additionally, this application claims the benefits of the earlier filed U.S. Provisional App. Ser. No. 60/067,073, filed Nov. 20, 1997 (20.11.1997), which is incorporated by reference for all purposes into this specification. Additionally, this application claims the benefits of the earlier filed U.S. Provisional App. Ser. No. 60/066,498, filed Nov. 24, 1997 (24.11.1997), which is incorporated by reference for all purposes into this specification. Additionally, this application is a continuation of U.S. patent app. Ser. No. 09/179,330, filed Oct. 27, 1998 (27.10.1998), now U.S. Pat. No. 6,118,304 which is incorporated by reference for all purposes into this specification.

BACKGROUND OF THE INVENTION

1. Field of the Invention

The present invention relates to semiconductor devices. More specifically, the present invention relates to the synchronization of logic within a semiconductor device.

2. Description of the Related Art

Clocking in Digital Logic
The Purpose of Clocks

Clocks are periodic signals used for timing and synchronization purposes in synchronous digital logic. Clocks define periods of time in which logic operations are performed by circuits. Logic operations involve the propagation of state through a series of logic gates.

In synchronous circuits logic state propagation is launched or initiated by a source clock edge. After propagating through paths of logic gates, the resulting logic state is sampled by a destination clock edge. The destination clock edge is generated from a clock event that follows the clock event that generated the source clock edge.

Since propagation of state through paths of gates takes time, for some period of time after the source clock edge, logic paths will contain state that is new (or valid for this cycle) and state that is old (invalid for this cycle). Generally, at the end of a period of time (often defined as a clock cycle), valid state has propagated through the entire path or collection of paths and there is no longer any invalid state in the circuit. The following clock edge starts the process a new.

Logical operations as implemented in electronic circuits propagate through paths of logic gates that diverge and converge. When logic paths converge or are combined with other paths they must do so at a similar point in time—this is the time at which the various convergent paths all have valid data. This point of time is determined by the arrival time of the latest arriving data. There are generally other, faster paths converging on this point that must hold their valid data until it has been successfully combined with the late-arriving data. In most digital circuits, the clock or clocks provide this synchronization function. Thus, clocks can be thought of as performing a regulating or governing function—they slow down or hold faster paths until the slower paths have become valid.

Generally speaking, it is required that logic circuits work as quickly as possible. It is therefore highly desirable that the clocks perform their regulating function while imposing as little penalty as possible on the operating speed of the circuit.

Clock Skew

Clock skew is a component of timing error that can both interfere with the regulating function of the clocks and reduce the maximum operating speed of the circuit. The definition of clock skew is that it is the difference in arrival times among clock edges that are derived from the same clock event but are associated with physically distinct clock nodes.

For example, a master clock is commonly distributed by some means to a large number of destinations. The distribution means may be as simple as a network of wires or may include many levels of active buffers. FIG. 1 illustrates a clock system with a single clock source (typically a phase locked loop, a PLL, or a digital delay loop, a DLL) followed by some number of generators. The generators reshape the single clock source into multiple clocks. The reshaping that occurs in a generator can be either a straight forward delay of the source clock, it can be an inversion of the source clock, or it can be a change of the shape of the clock waveform (e.g., change in duty cycle, change in slew rate, etc.) Or it can also be any combination of the previous transformations. In any case, the propagation time of a clock edge through this distribution path requires some non-zerotime. The propagation time to each destination can be tuned by design to be smaller or larger according to the needs of the design. In practice it is expensive (in terms of design effort) to analyze or model the clock distribution circuit so as to predict actual clock skew with total accuracy.

Actually, even with perfect design knowledge it is impossible to control skew with total accuracy because of normal manufacturing variations across a circuit. For example, a certain clock distribution wire may be somewhat more resistive in part of the circuit due to localized variations in interconnect thickness or width. This could result in a consistently longer delay to the clock destination at the end of this wire relative to other clock destinations on a particular die.

It can be seen then that clock skew has both predictable and unpredictable components. With some degree of difficulty, the designer can adjust or control clock skew within certain limits. In practice, this control is limited by the available design time and also by normal manufacturing or environmental variations. As a result of the difficulty in perfectly controlling clock skew and because of the detrimental effects of clock skew, it is important that a design be tolerant of some uncertainty in clock skew among the various clock destinations.

Clock Jitter

Like clock skew, clock jitter is a component of timing error that can adversely affect the regulating function of the clock and also the operating speed of the circuit. Clock jitter is defined to be the error or variation in arrival time of a clock event on a single clock node. This error or variation is relative to an ideal or intended arrival time, usually specified with respect to an immediately prior clock event. Thus, while clock skew describes arrival times of the same event at physically separate locations, clock jitter describes arrival times of different events at the same physical location. Clock jitter may be somewhat different at each clock node.

Clock jitter is rarely if ever intentionally introduced into a clock network (one exception is intentional frequency modulation of the clock). Jitter can be caused by several factors. Jitter may be present on the input clock of the circuit. This generally is passed along through the distribution network. Additionally, it may be introduced by part of the clock generation logic such as a PLL. For example, FIG. 4 illustrates the introduction of jitter by the clock generation logic, which shows a feedback-base control system (a typical PLL) coupling to a transfer function of Z(s) (the clock generator). The PLL contains a steady state phase error that affects edge placement. Noise injected into the system at various points will cause transient responses in the system. Noise can occur in the reference signal O(t), the phase comparator, the loop filter, the voltage controlled oscillator (VCO), the clock generator (Z(s)), or on any of the wires connecting the components. For these components, the primary source of noise is the voltage sources (power and ground), and for the wires, it is coupling noise.

Clock jitter can also be caused by power supply noise and by inductive or capacitive signal coupling. The effect of jitter is to shorten or lengthen clock periods as perceived by certain parts of the circuit. For example, if a certain clock edge is delayed from the arrival time predicted by the prior edge, the ending clock period is lengthened while the following clock period is likely shortened.

Clock jitter that varies among various clock destinations can also increase clock skew. For example, local supply noise may cause a clock edge to arrive early in one location while the same clock edge may arrive on time at another location.

Clock jitter may be short term, causing a cycle to cycle variation in the clock period, or may be longer term, affecting a series of sequential cycles in a similar way. Jitter may also cause the duty cycle of a clock to vary from its intended value. There are usually both short and long term components of jitter present in a clock.

Setup and Hold Hazards

Setup and hold time hazards could exist even with no clock skew or jitter, but skew (especially unpredictable skew) and jitter generally increase the likelihood and severity of these hazards. A setup hazard occurs when a clock edge is sampling data that is arriving very late relative to the clock. If the data is too late or the sampling clock is early relative to its intended arrival time then invalid data is sampled and the circuit operates incorrectly. These hazards are also called slow path or critical path hazards because they are associated with the paths in the design with the longest propagation delay.

Since logic paths are initiated with a source clock and terminate by being sampled with a destination clock, setup hazards are affected by delays between source clocks and destination clocks as well as by logic path delays. Setup hazards are reduced in severity or even eliminated by slowing down the clock frequency. Thus, setup hazards limit high frequency performance of a digital circuit but do not prevent correct operation at a lower frequency.

A hold hazard, in contrast, occurs when a clock edge incorrectly samples data that has been valid but becomes invalid again before the sampling period has completed. Hold time problems are also called fast path problems.

As stated earlier, a destination clock edge is normally generated from a clock event that follows the clock event that generated the source clock edge. Hold time violations occur when data is sampled by a destination clock edge that is actually derived from the same clock edge that generated the source clock. This can occur when data propagates too quickly from source to destination or the destination clock edge occurs too late relative to the source edge that was generated from the same root clock event. It is important to note that because hold time hazards are related to timing between clock edges that are derived from the same event, hold time hazards are not alleviated by changing the clock frequency. Hold time violations prevent the circuit from operating at any frequency. For this reason they are a more severe failure than setup time problems. Hold time problems can be fixed by inserting additional delay into the fast data path, by delaying the source clock, by speeding up the arrival time of the destination clock or by some combination of these methods.

The Cost of Synchronization in Static Logic

The portion of the cycle associated with logic synchronization is called synchronization overhead and represents time spent doing no computational work. Obviously for high performance design, one would like to maximize the amount of work one can accomplish in a given time. Any time spent on synchronization overhead detracts from this goal by reducing the computational efficiency of a design.

FIG. 2 illustrates a simple logic path that comprises two logic paths. One path starts at flip-flop 1 and ends at flip-flop 2. The other starts at flip-flop 2 and returns to flip-flop 1. If there is no unpredictable skew or jitter in the clocks, then the cycle time determined by the round trip delay through these two paths is given by $$T \blacktriangledown (O_1 + D + S_2 + O_2 + D^\blacktriangledown + S_1)/2 \qquad (1)$$

where $O_i$=output delay of flip-flop i, $O_1$ and $O_2$=output delay of flip-flops 1 and 2, respectively $S_1$ and $S_2$=setup times for flip-flops 1 and 2, respectively $S_i$=setup time for flip-flop i, and D, $D^\blacktriangledown$ are the delays through the logic paths FIG. 3 illustrates a typical clock signal with a 50% duty cycle. The clock period, T, is measured from the mid-point of the rise of the clock signal to the midpoint of the next rise of the clock signal. Skew is represented as a shaded area around the rising and falling edges of the clock. Note that the first rising edge is taken as a reference point, so it has no skew. It also important to note that this picture is representative of the situation, but that in reality we are talking about skew between unique points in the clock network. Relating FIG. 2 and FIG. 3, the first rising edge of the clock (of FIG. 3) is measured at the clock input of flip-flop 1 (of FIG. 2), while the next rising edge of the clock is measured at the clock input of flip-flop 2.

The predictable clock skew is fairly straight forward to deal with and can even be used to advantage in some cases. For example, if one knows that flip-flop 2 gets a slightly later version of the clock than flip-flop 1, then the designer can actually allow the data to arrive slightly later. Note that in this case, flip-flop 1 gets a rising edge early relative to flip-flop 2, so in the next cycle, there is less time to get through the logic gates. Flip-flop 1 has no skew relative to itself, so the data must get through the entire loop path in two cycles. If all skew were predictable, then Equation (1) would describe the minimum cycle time; the two path delays are averaged in this case.

Unpredictable clock skew produces a different problem. If a designer does not know what the skew is between flip-flop 1 and 2 is, then the designer must assume the worst, i.e., on the first cycle, the assumption is that flip-flop 2 is early compared to flip-flop 1 and on the second cycle the assumption is the opposite. This way, no matter what case is true, the data arrives in time. Unfortunately, this means that for this portion of the skew, a designer cannot take advantage of a late clock as above. Equation (2) describes this two-cycle path as the following:

$$T \blacktriangledown (O_1 + D + S_2 + O_2 + D' + S_1 + 2K^6)/2 \qquad (2)$$

where $K_u$=the uncertain portion of the clock skew.

If the effect of clock jitter is also added to the delay equation, we have:

$$T \blacktriangledown (O_1+D+S_2+O_2+D\blacktriangledown+S_1+2K_u+2J)/2 \qquad (3)$$

where J=the clock jitter.

The causes of unpredictable clock skew are independent of the frequency of the clock. This is also true of the flip-flop delays ($O_f$, $S_f$), and generally true of the clock jitter. This presents a real problem for high-frequency design because as one designs for higher and higher frequency in a given technology, the percentage of the clock dedicated to synchronization overhead increases. At some point, this overhead becomes dominant, and the benefits of higher frequency design are overwhelmed by the decreased computational efficiency of the logic circuits. Clearly for very high frequency design, a designer needs to explore methods that minimize synchronization overhead.

One design method for minimizing synchronization overhead involves splitting apart the two latches that form a flip-flop and placing logic between the two latches. The designer then times the logic such that the latches are transparent when the evaluate edge (of the clock signal) of the slowest logic path arrives at their inputs. Now, as clock skew results in the clock edges controlling the latches moving around in time, the slowest path is unaffected (assuming that clock skew is not too large). This is a skew-tolerant design. The clock skew in this type of design can be as large as the time between the ideal clock edge time, and the time where the evaluate edge of the slowest path arrives at the input of the latch. If the designer times it so that the evaluate edge arrives at the middle of the positive clock pulse for each latch (the time when the clock is high), then the design can tolerate a full quarter cycle of skew. Another benefit of this scheme is that the evaluate edge can be a little bit off from this point (assuming the skew is less than the quarter cycle) without penalty. A skew tolerant design therefore removes the skew penalty and the output and setup delay through the latches from the cycle time. This design adds, however, a propagation delay through the latches, which changes the equation for the cycle time to the following:

$$T\blacktriangledown(D_1+D+D_2+D\ddot{A}+2J)/2 \qquad (4)$$

where $D_1$ and $D_2$=delay through latches 1 and 2, respectively

D and D▼=delays through the logic paths

J=the clock jitter.

The above design style does not eliminate the effect of long term clock jitter, which is to shorten the clock cycle time. While the delay penalty of the latch propagation time is present, this penalty is generally less than the penalties incurred with flip-flops.

Synchronization in Clocked Precharge Logic

Clocked precharge (CP) logic is a design style that often has a speed advantage over static CMOS logic, and can additionally provide an advantage in overcoming synchronization penalty. Unlike static gates, CP gates have inherent synchronous characteristics. A CP gate has two principal phases of operation: precharge and evaluate. Since it can onlys witch once during the evaluate phase, it can be thought of as holding its value until the start of the precharge phase. More importantly, a CP gate cannot switch until the start of its evaluate phase (unlike static CMOS gates that may switch whenever their inputs change).

CP gates are connected and clocked in such a way that the first gate in a series evaluates, causing the next gate to evaluate and so on until all gates in the path have evaluated. When the clock to these gates (call this clock PH1) switches to its precharge state, these gates precharge and lose their state. It is therefore necessary to store the result of the computation prior to precharging the gates. This is commonly done by latching the output values of the final gates in the string at the end of the evaluation period (i.e., with a clock similar to the CP gates' PH1 clock), before their precharge begins. This structure is then similar to the arrangements of static logic gates in a latch-based design style. It is common for this latch or set of latches to provide inputs to another series of CP gates that are clocked by a clock that is the inverse of the clock of the first set of CP gates (call this clock PH2). In this way, the second set of CP gates are precharged while the first set is evaluating and while the latch between the two sets of CP gates is transparent. When the first set of gates are precharged (when PH1 is low), the latch holds its state and the second set of gates, sensing the latch output(s), begin evaluating. Similar to the first set of CP gates, the results from the second set of CP gates must be latched during their evaluation phase (when PH2 is high). The output of the second type of latch (PH2 latch) can then drive more CP gates of the first type (PH1 CP gates). This logic and synchronization style is known as skew-intolerant CP logic because it is sensitive to the skew and jitter of the clock edges. FIG. 5 illustrates this type of logic.

Cost of Synchronization in Skew-intolerant CP Logic

Skew-intolerant CP logic suffers from the previously mentioned clocking penalties. The CP gates can only evaluate during the time that the clock is high, but must finish evaluating by the time the clock switches from high to low so that the result can be stored in the latch at the end of phase. This style is affected by the unpredictable skew on both edges of the clock since the computation result must be set up to the latch in time to be sampled. If the data is late or the latch clock is early, incorrect results are sampled. Thus, referring again to FIG. 5, the following equation describes the cycle time:

$$T\blacktriangledown D_0+D+D_1+D\blacktriangledown+2K_u+2J \qquad (5)$$

where $D_I$=delay through latch I, $K_u$=the uncertain portion of the clock skew, J=the clock jitter.

This synchronization scheme suffers from problems very similar to the problems encountered in flip-flop based static logic design.

Logic synchronization is the process of controlling the timing of all of the logic signals in a system. The present invention is a method and apparatus that describes a synchronization mechanism that tolerates skew and jitter as much as possible in order to lower the minimum operating cycle time for a logic device. A synchronization mechanism is best understood in the context of a logic family, however, and the logic family used to illustrate the present invention is the N-narylogic family described in copending patent application, U.S. patent application Ser. No. 09/019,355, filed Feb. 5, 1998 (05.2.1998), now U.S. Pat. No. 6,6066, 965, titled "Method and Apparatus for a N-Nary logic circuit using 1 of 4 Encoding," which is incorporated by reference for all purposes into this specification. Briefly, the logic gates in this family can be thought of as non-inverting clocked precharge circuits that precharge when the clock input signal is low, and evaluate when the clock input signal is high. FIG. 10A illustrates a 1 of 4 logic circuit that is typical of the N-nary logic family.

An efficient processor design operates logic gates at their maximum speed, where the speed of a gate is the sum of its logic propagation time and its node restore time. Static logic gates "restore" when the gates encounter new input values. Dynamic gates, on the other hand, require an explicit precharge operation to prepare for the next set of inputs. A logic gate is operating at its duty-cycle limit when there is no time when the output is not either transitioning to an evaluate level or to a precharge level. FIGS. 9A and 9B illustrate this concept where $t_e$ is the evaluation time, $t_p$ is the precharge time, and $t_{so}$ represents a stable output.

A given dynamic gate has one or more inputs and one output of interest. When in the evaluate phase, the output of a dynamic gate responds to the input. When in the precharge phase, the output of a dynamic gate returns to a restored level. Note that FIGS. 9A and 9B show the gate (output) transitioning at every evaluate period. This is not the case with traditional dynamic gates, which will only transition when the gate evaluates "true." N-nary logic, however, comprises a plurality of wires where one and only one wire transitions at every evaluation. In some cases, zero wires may evaluate, thus the output may not transition. Therefore, when viewed in terms of signals in N-Nary logic, FIGS. 9A and 9B are representative of the output signal of N-Nary, which is the equivalent of the OR of the output wires as illustrated in FIG. 10B.

FIG. 9B shows the desired operating mode of a dynamic gate. There is little or no time when the output signal is stable since once the output signal is read (as it completes its transition) the gate begins restoring. And, once the gate finishes its restoration, it begins transitioning again. Under these conditions, we know that the logic gate is delivering as many logical operations in a given period of time as the gate is capable of delivering.

FIG. 9A shows, however, a more realistic application of dynamic gates as is typical in prior art systems. As one can see, a substantial amount of additional time is necessary both after the evaluation of the logic gate and after the precharge phase of the logic gate. There are many techniques found in the prior art that make tradeoffs by focusing on the evaluation and precharge periods. Unfortunately, there is nothing in the prior art that focuses directly on the efficiency of a gate. By focusing on improving the gate efficiency, the present invention produces a better set of guidelines for creating a processor with maximum performance, and additionally, develops an alternate clocking strategy derived directly from the nature of the technology.

Some logic gates are faster than others. Typically, the slowest gates are the concern for the designer, while the designer can often ignore the faster gates. Gate speed is more of an issue for dynamic logic because the clocking required of dynamic gates restricts the position within the clock cycle where the gates can perform their desired function. Static logic, on the other hand, performs its function at all times. Whenever an input arrives, a static gate switches accordingly. Nonetheless, an efficient clocking strategy should tolerate dynamic logic gates performing their function in as wide a time period as is possible.

U.S. Pat. No. 5,517,136 to Harris et al. and titled "Opportunistic Time-Borrowing Domino Logic," is an attempt at an efficient clocking strategy. A feature of this patent is that it provides some degree of time borrowing between certain clock domains. The objective of the Harris patent is to eliminate the need for output storing latches at the end of each half of the clock cycle, which by its nature allows some degree of time-stealing, or what this patent calls "opportunistic time borrowing." The non-symmetric nature of the timing or synchronization of the clocks in the Harris patent, however, limits the locations within the clock cycle where borrowing of time can actually occur. In fact, because borrowing cannot occur at some points within every path, the performance of the clocking strategy must be affected by clock uncertainties.

Harris extends the above clocking scheme to a more generalized approach for multi-phase clock systems in a follow up paper to the patent, Harris, D., and Horowitz, M., Skew-Tolerant Domino Circuits, IEEE Journal of Solid-State Circuits, Vol. 32, No. 11, pp. 1702–1711 (November 1997). In addition to extending the Harris patent to a more generalized approach for multi-phase clock systems, the Harris paper attempts to encompass tolerance for clock skew within the clocking scheme. Unfortunately, this paper does not differentiate between predictable and unpredictable clock errors. Additionally, this paper does not appreciate the impact that clock jitter, in addition to skew, has on a clocking scheme, it does not develop a metric for gate efficiency to guide practical designs, and it argues against clocking strategies similar to what is disclosed in this disclosure.

Another prior art patent, U.S. Pat. No. 5,434,520 to Yetter et al and titled "Clocking Systems and Methods for Pipelined Self-Timed Dynamic Logic Circuits" is another attempt at optimizing the clocking of a system by focusing on improving the evaluation and precharge periods. This patent, like the above Harris patent and Harris paper, implements an awkward and inefficient clocking system where only portions of the inefficiencies in traditional dynamic logic families are improved.

Overlapping Clocks Using Stretched Clocks

FIG. 6 illustrates one technique to accomplish logic synchronization, which is by 'stretching out' the clock cycle. As previously mentioned, there are numerous examples of stretched clocks in the prior art including the Harris patent, the Yetter patent, and the Harris paper. One sees that the latches are shown in the period of time when both clocks are high, so there is a period of time when a latch is transparent, and CP gates on either side of it are in evaluation mode. This means that within the overlap window, the evaluation edge can pass through the latch and immediately continue through gates on the other side. Assuming the latch is placed in the time when both clocks are undeniably high (i.e., not in the shaded skew area shown in the figure), then much like the transparent latch design style, the skew is not a problem. Equation 6 shows a relationship for cycle time if one uses stretched clocks in this manner.

$$T \blacktriangledown (D_0 + D + D_1 + D' + J) \tag{6}$$

where Di=delay through latch I,

J=the clock jitter

Another advantage a designer can get with stretched clocks is in the latch delays. The reason for the latches being in the path was to hold the result of a phase of logic during the transition from one phase to the next. With the overlapped clocks, it is possible to have logic feeding from a gate in one phase to a gate in the next phase during the time they are both in evaluate mode. This means that the latches are superfluous. The only requirement is that the earlier gate not precharge before its value has propagated through the later gate. FIG. 7 shows a path implemented with this scheme and Equation 7 describes the cycle time of the clock as follows:

$$T \blacktriangledown (D + D \blacktriangledown + J) \tag{7}$$

where J=the clock jitter.

Problems with Stretched Clocks

There are some problems with this synchronization scheme however. A greater than 50% dutycycle on the clocks poses many of the same physical difficulties not described in this disclosure. Additionally, the hold time problems are aggravated. A system with stretched clocks will now cause a fast path to have a hold-time problem even without considering skew and jitter. Hold-time problems require additional design work to tune fast paths. In typical designs, there are a few critical paths (potential setup-time problems) that need careful tuning, while there are potentially many fast paths. The work done in tuning clocks has a reward in that the performance of the logic chip improves as one tunes these paths. There are also fast paths (potential hold-time problems) that the designer now must tune as well. Tuning these paths generally means inserting delay (increased area), or 'fiddling' with clocks (prone to error and requiring a great deal of analysis). While it is necessary to fix hold-time problems in order to have a functional chip (at any frequency), there is no performance benefit for doing so.

There are a variety of ways to synchronize the logic circuits within a pipeline on an integrated circuit. For example, FIG. 16 illustrates a typical 4 clock system used in the Harris patent and the Yetter patent. This type of clocking system usually involves a master clock, $CLK_1$, and its inverse, $CLK_3$. The other two clocks, $CLK_2$ and $CLK_4$, are clocks with stretched clock cycles that may be coincident with the master clock or its inverse. For example, the leading edge of $CLK_2$ is coincident with the leading edge of $CLK_1$, and the leading edge of $CLK_4$ is coincident with the leading edge of $CLK_3$. Each full cycle of the clock signal has two parts, an even half cycle, $t_x$, and an odd half cycle, $t_y$. Each full cycle of the clock signal also comprises a precharge period, $t_p$, and an evaluate period, $t_e$. A common feature of this type of clocking system is its evaluation window 220, which has some overlapping phases but only due to the clocks with stretched clock cycles.

FIG. 13 illustrates a typical dynamic logic circuit as described in the Yetter patent, which this patent calls a "mousetrap" logic circuit. This circuit comprises a logic circuit 24 that performs some type of logic evaluation on the two input signals 26 and 28 to produce an output signal 32. Coupled to the logic circuit is an output buffering device, which here is the inverter 30. Additionally, coupled to the logic tree circuit is the precharge device 22 that uses a clock signal CK to determine the time period for recharging the dynamic node of the logic circuit. One disadvantage to this type of dynamic logic circuit is the difficulty in using this type of circuit in pipelining. Another disadvantage is that the clocks cannot be stopped without losing information. The clocking synchronization of the present invention overcomes these disadvantages by using multiple clock domains with overlapping phases.

FIG. 14A and FIG. 14B illustrate the output buffering devices in the Harris patent (U.S. Pat. No. 5,517,136). FIG. 14A depicts Harris's FIG. 1 and FIG. 14B Harris's FIG. 2. The circuit of FIG. 14A uses an output buffer that is similar to the half signal keeper of the present invention. When the output of the inverter is low this transistor holds the input high, making the gate stable. When the output is low, however, the input node can float when the inputs to the gate are removed. The circuit of FIG. 14B uses an output buffer that is similar to the full signal keeper of the present invention that includes an N-channel transistor specifically for the purpose of holding the output low when the input did not discharge.

FIG. 14A consists of a logic circuit 41 that further consists of the input signals A and B. The input signal A connects to NFET 44, and the input signal B connects to NFET 42. NFET 40 is the evaluate device for this circuit, and PFET 46 is the precharge device. Both the evaluate device and the precharge device connect to the clock signal CLK. This circuit also contains an output buffering device that consists of inverter 50 and PFET 48. The output of logic circuit 41 connects to the inverter 54, which Harris denotes as a high skew device. Output 56 connects to the next logic circuit that could be, for example, the next circuit in a pipeline. Harris calls this type of logic circuit with its output buffering device a D1 type gate.

FIG. 14B consists of a logic circuit 61 that further consists of the input signals A and B. The input signal A connects to NFET 64, and the input signal B connects to NFET 62. NFET 60 is the evaluate device for this circuit, and PFET 66 is the precharge device. Both the evaluate device and the precharge device connect to the clock signal CLK. This circuit also contains an output buffering device that consists of the inverters 68 and 70. The output of logic circuit 61 connects to the inverter 72, which Harris denotes as a high skew device. Output 76 connects to the next logic circuit that could be,for example, the next circuitina pipeline. Harris calls this type of logic circuit with its output buffering device a D1K type gate.

An optimal clocking implementation allows enough borrowing of time from one dynamic gate to the next to account for the differences in gate speed between simple and complex gates, between gates with small and large output loads and differences in speed due to manufacturing variations, and it does so at all points in all paths. The present invention overcomes the above problems in the prior art by implementing a very flexible logic synchronization method and apparatus that uses multiple clocks with overlapping phases.

SUMMARY OF THE INVENTION

The present invention is a method and apparatus that synchronizes logic in an integrated circuit (IC). The present invention comprises a global clock signal with a global phase and an approximately 50% duty cycle. Additionally, the present invention comprises a first local clock signal with a first phase and an approximately 50% duty cycle that couples to a first dynamic logic gate where the first local clock signal is generated from the global clock signal. Also, one or more intermediate local clock signals with one or more intermediate phases are generated from the global clock signal where each intermediate local clock signal has an approximately 50% duty cycle that couples to one or more intermediate dynamic logic gates. And, an end local clock signal with an end phase and an approximately 50% dutycycle that is also generated from the global clock signal and that couples to an end dynamic logic gate. The phase of an individual local clock signal overlaps an earlier phase local clock signal by an amount approximately equal to the overlap of the phase of the next individual local clock signal. The first dynamic logic gate, the intermediate dynamic logic gate(s), and the last dynamic logic gates couple such that an individual dynamic logic gate with an individual local clock signal and phase may only provide a signal to the next individual dynamic logic gate that uses a next phase local clock signal where the gates may couple together in series, in a feed back loop, or a feed forward loop.

One embodiment of the present invention provides that the first local clock signal, the intermediate local clock signal(s), and the end local clock signal overlap in such a way that two or more of the first, intermediate, or end local clock signals overlap in their evaluate phase at any point in time. Another embodiment of the present invention provides that a dynamic logic gate has one gate delay per clock phase. Another embodiment of the present invention uses a clocked precharge logic gate. And finally, another embodiment of the present invention provides that the first, intermediate, or end dynamic logic gates couple to each other or to other dynamic logic gates without additional buffers, registers, latches, or static circuits.

DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a method and apparatus that synchronizes logic in an integrated circuit (IC). This disclosure describes numerous specific details that include specific structures, circuits, and logic functions in order to provide a thorough understanding of the present invention. One skilled in the art will appreciate that one may practice the present invention without these specific details. Additionally, this disclosure does not describe some well known structures, such as transistors, in detail in order not to obscure the present invention.

Wave-clocked Skew Tolerant CP Logic

A designer of high performance systems would like to keep the advantages of the 2-phase overlapped clocks and the multi-phase clocks with stretched clock cycles, but get rid of the disadvantages. The advantages come primarily from the fact that gates in adjacent phases are both in evaluate mode for some period of time (called the phase transition time). The biggest disadvantages are associated with the fact that all gates are in evaluation mode at the same time.

A 50% (or near 50%) duty cycle clock is desirable. One reason for this is that duty cycle skew can be controlled by dividing in half a source clock that has good cycle time jitter characteristics. What would happen, however, if a system used three 50% duty cycle clocks that were 120 degrees out of phase? The duty cycle of the clock is of particular importance. A 50% duty cycle provides an equal amount of time for a gate output to rise as to fall. If the clock duty cycle deviates significantly from 50%, less time is allowed for either the precharge or evaluate phases of operation. This requires the precharge or evaluation transistors to be sized larger so that they can complete their operation in the allotted time. This is an inefficient use of transistor area. Furthermore, larger precharge transistors, while speeding up the precharge time of the CP gate, actually present more load to the evaluate transistors, slowing the evaluation time slightly. The reverse is true also; if the evaluate transistors are made larger to speed up gate evaluation time, the precharge transistors will also have to be made larger so that they can precharge the larger load in the same time.

Figure 2:
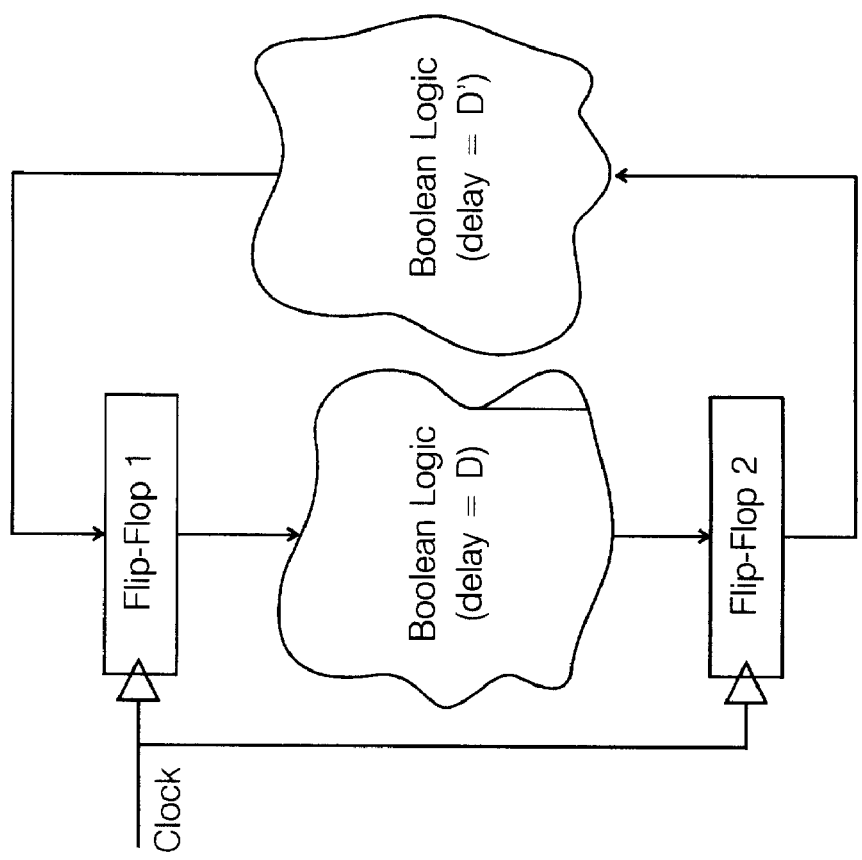
FIG. 2 illustrates a simple logic path starting and ending with flip-flops.
Figure 1:
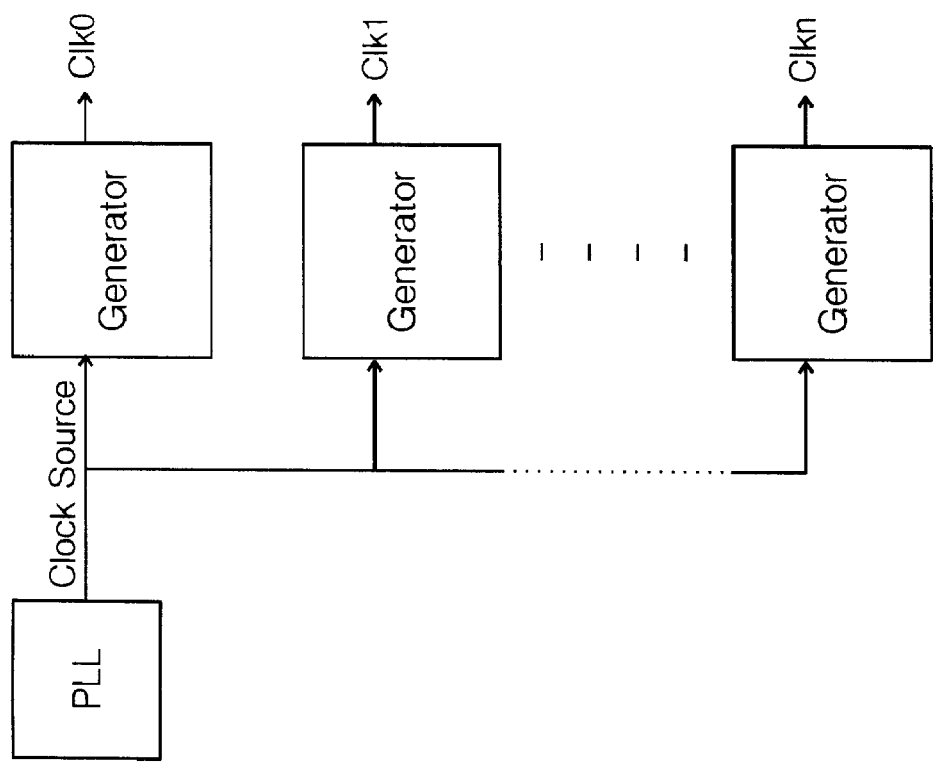
FIG. 1 illustrates a clock generation system.
Figure 3:
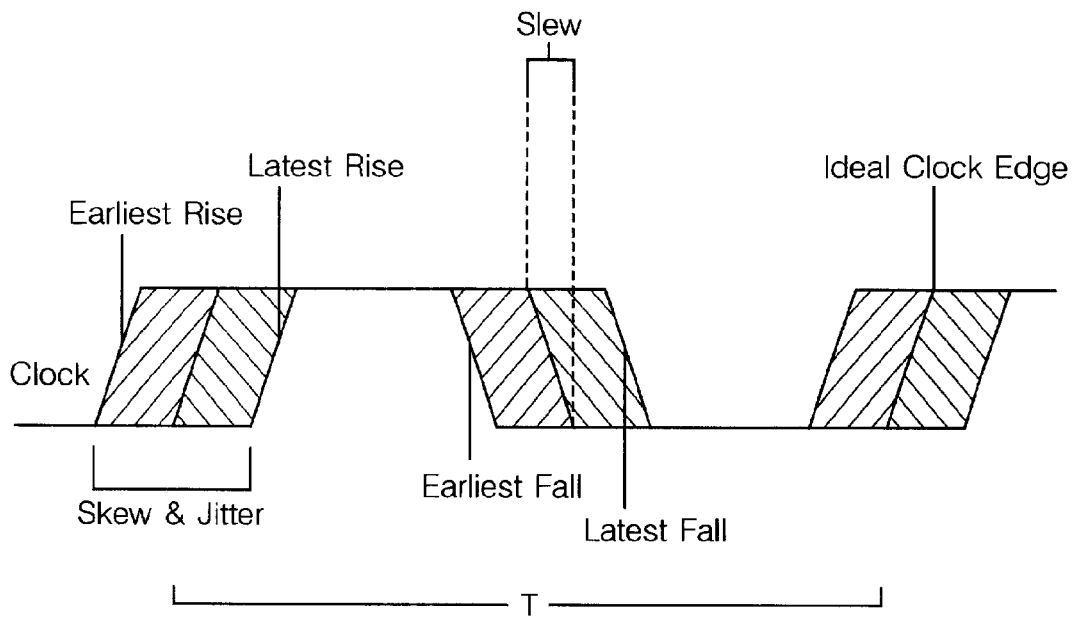
FIG. 3 is an example clock signal.
Figure 4:
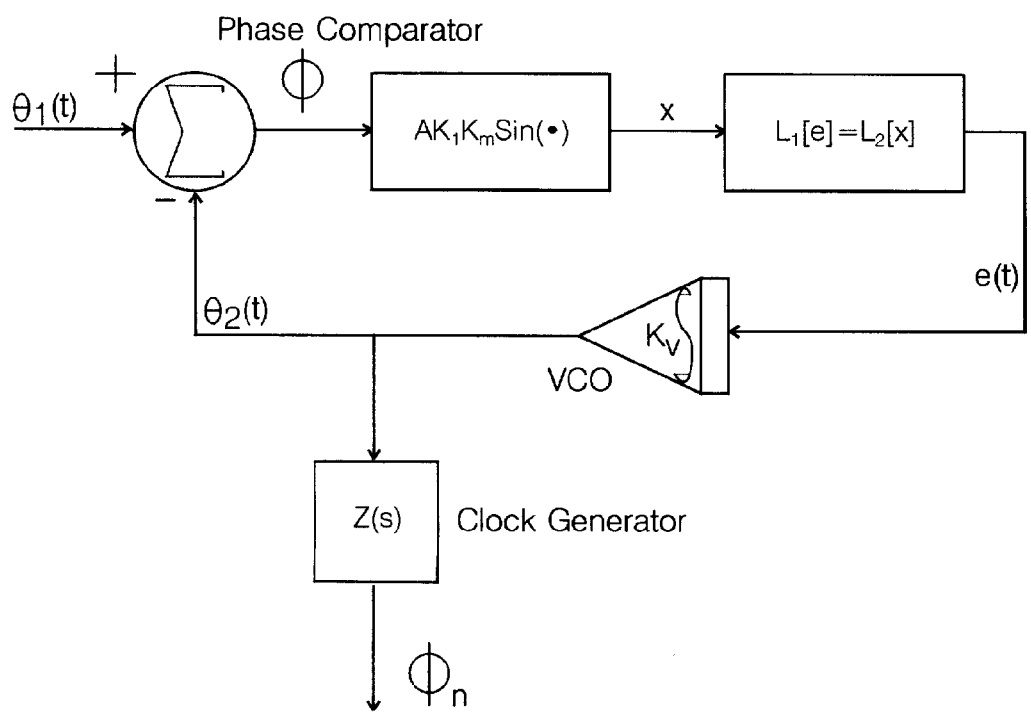
FIG. 4 illustrates a clock generator.
Figure 5:
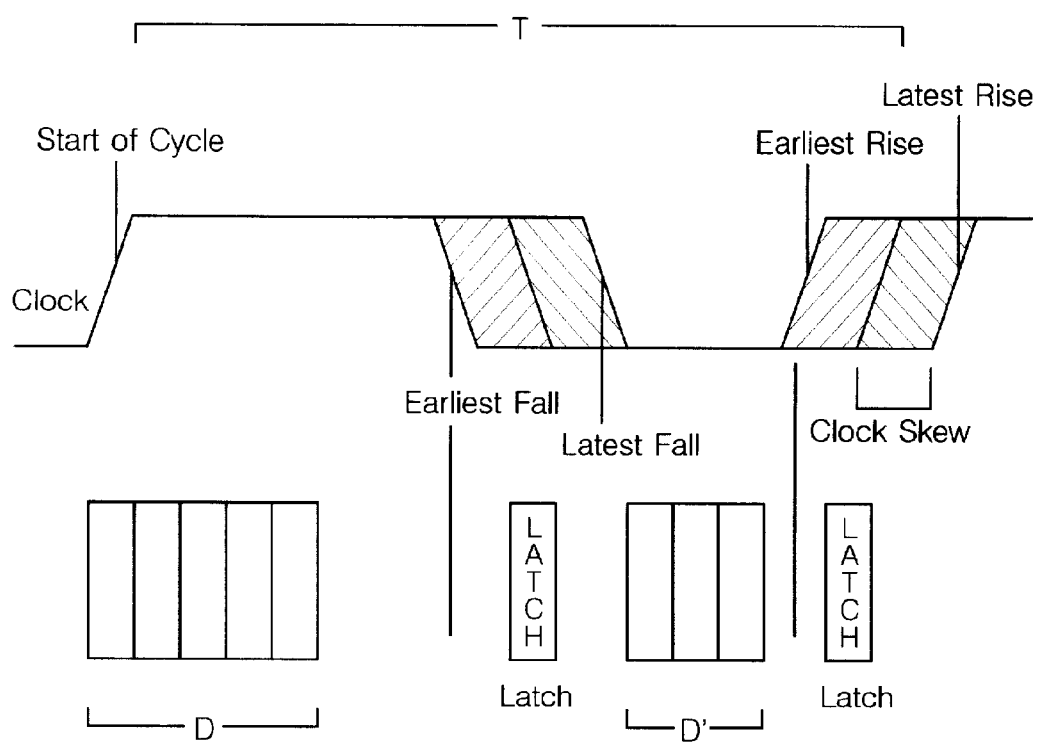
FIG. 5 illustrates skew intolerant logic.
Figure 6:
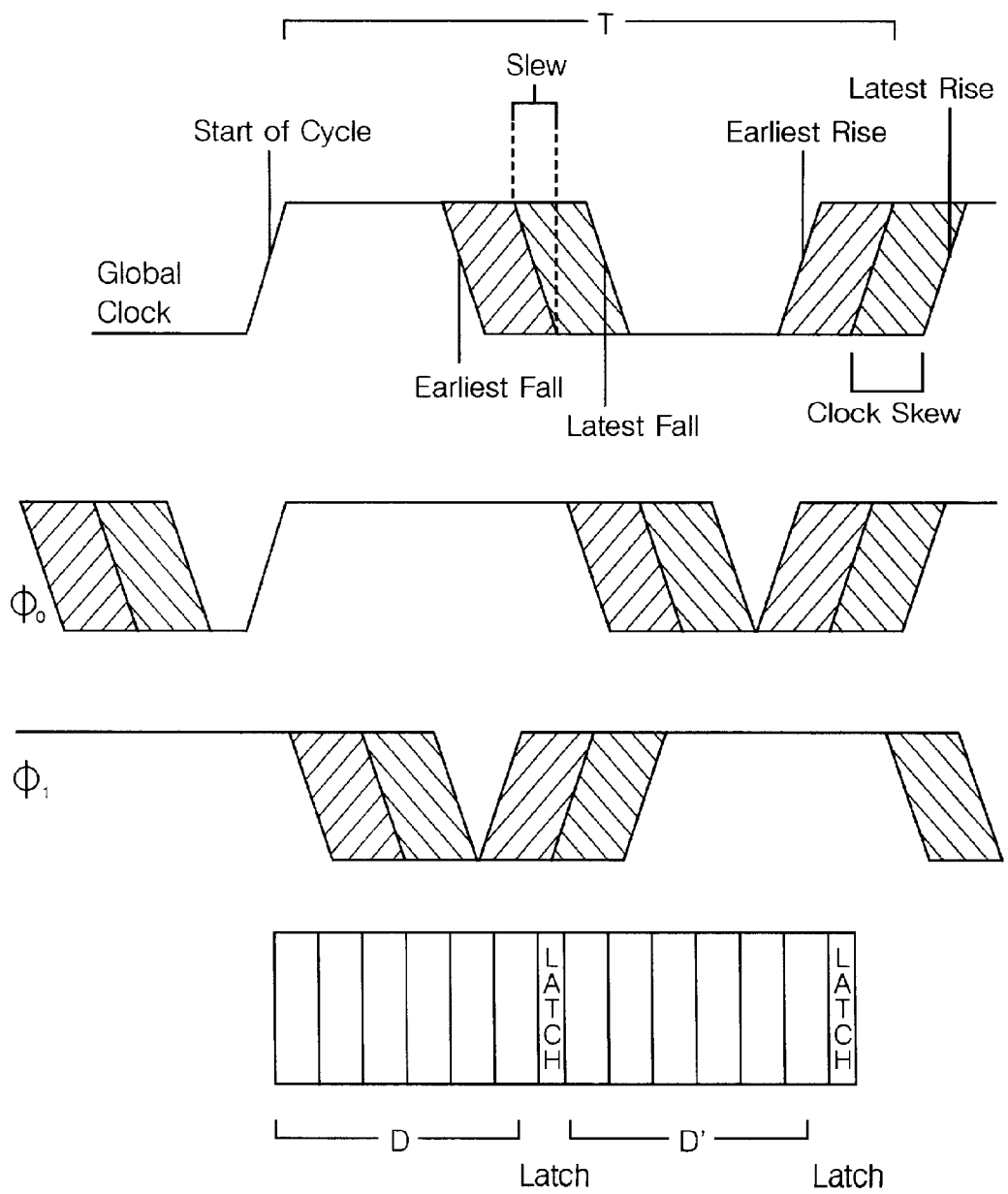
FIG. 6 illustrates logic clocked with a 2-phase clock.
Figure 7:
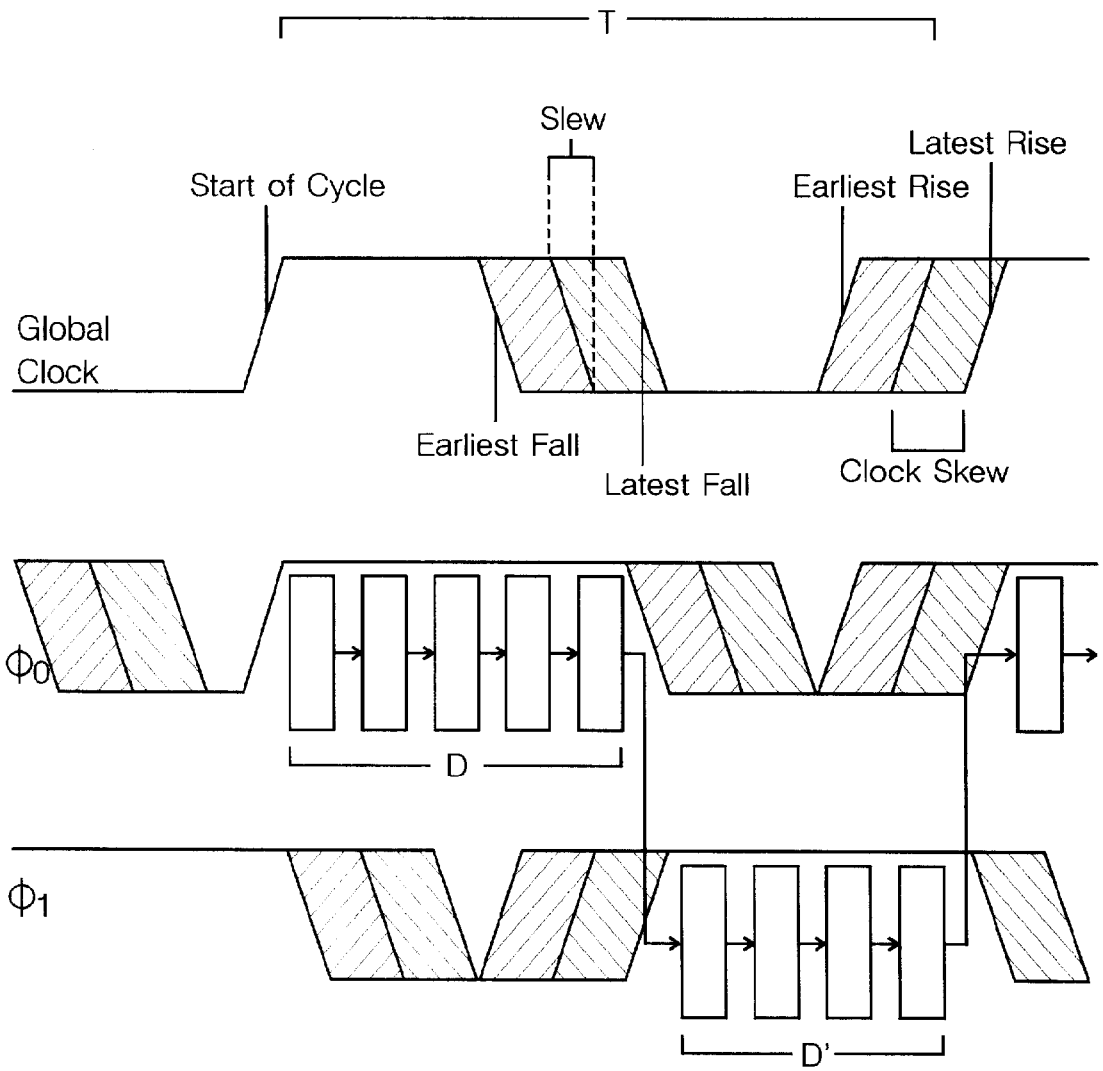
FIG. 7 illustrates logic clocked with a 2-phase clock.
Figure 8:
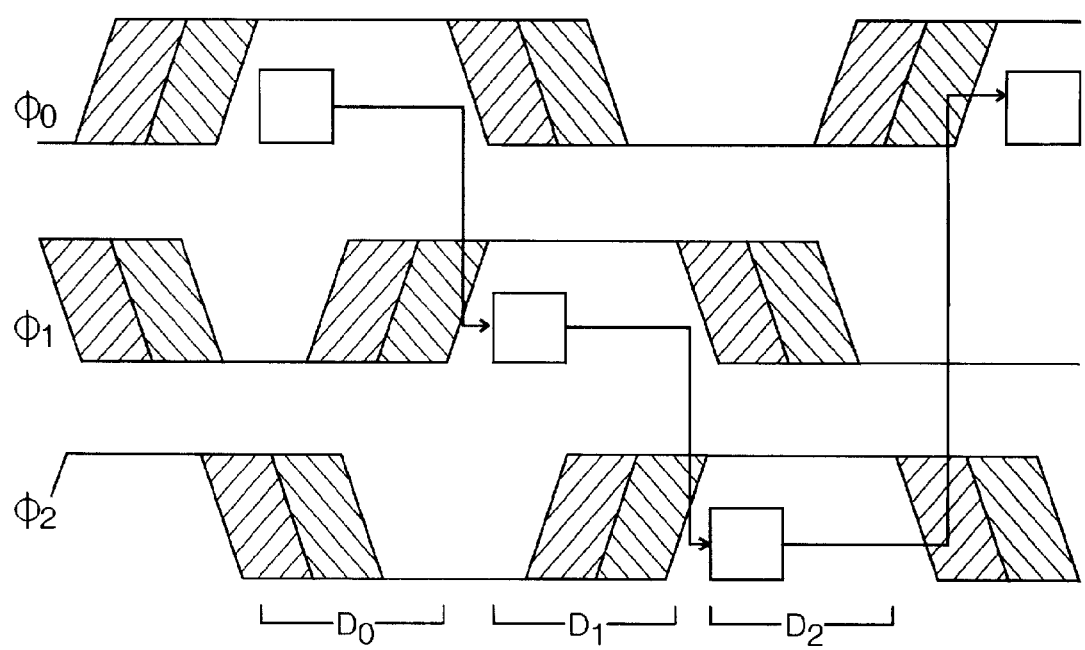
FIG. 8 illustrates an embodiment of the present invention with a 3-phase clock.

FIG. 8 illustrates an embodiment of the present invention showing 3 clock signals or domains with 50% duty cycles and overlapping clock phases that are 120 degrees out of phase. A system with overlapping clocks can transition easily from one phase to the next. With all the clocks at approximately a 50% duty cycle, there is no time where all three clocks are high. Another way of describing the overlapping nature of the present invention is that any two consecutive clock signals are overlapping in their evaluate phases. The 50% duty cycle clocks are straight forward to generate, and allow for half the cycle to precharge the CP gates. Since there is no time where all three clocks are high, if we force every path to have at least one gate in each phase, then we are guaranteed to be free from hold-time problems—there is no way for a signal to propagate through to catch up with the previous group of signals. Assuming that we can transition outside the skew range (shown shaded in FIG. 8), the propagation time of the slowest signals (and therefore the cycle time) is not affected by the clock skew. Equation 8 shows a relationship for cycle time where:

$$T \nabla (D_0 + D_1 + D_2 + J) \tag{8}$$

where J=the clock period jitter and $D_i$ is the propagation delay of gate i.

The importance of this practical aspect of the invention cannot be overestimated. While prior-art solutions can provide efficient designs, they require substantial skill and time on the part of the designer, making the design process inefficient. The objective of efficient high performance design requires both that the design be efficient and that the design process be efficient.

Returning to the 3-phase clocks in the above example, we next look at the amount of clock phase overlap and its meaning and see that there is an overlap time of T/2−T/3 or T/6. This means that there is a window of one sixth of a cycle to transition from one phase to the next. Note that this is the overlap time for an ideal clock. This overlap time is reduced by skew and jitter. In general, if there are N clock phases, the resulting transition window time ($W_t$) is given by Equation 9 as follows:

$$W_t = T/2 - T/n - (J + K_u + K_c) \tag{9}$$

where J=the clock jitter,
$K_u$=the uncertain portion of the clock skew,
$K_c$=the controlled portion of the clock skew,
T=the ideal cycle time,
n=the number of phases, and
$W_t$=the transition window time.

Apart from the effects of jitter and skew, the overlap between a phase and the prior phase is the same as that between the phase and the next phase. FIGS. 18A, 18B, 18C, and 18D illustrate the overlapping phases for 3, 4, 5, and 6 clock domain systems.

A designer's target is for the evaluate edge to pass through the center of this transition window, which will maximize the skew tolerance. Looking at Equation 9, one sees that as the number of phases increases, there is a corresponding increase in the size of the transition window. If one assumes that the delay through various logic gates is approximately the same, then the size of the window is not terribly important, but if there is a significant variance in the delay through different logic gates (as is normally the case), then the designer will have difficulty getting the evaluate edge to hit the center of the transition window. If the designer misses by too much, then the system will run into skew problems, and may need the clocks slowed down to increase the size of the transition window. This argues for maximizing the number of phases in the clock. The number of phases is then determined by the number of gates in the longest path. Therefore, the designer wants to set the number of phases such that there is precisely one gate delay per phase for the critical path. All other paths will be required to have the same number of phases (paths shorter than the longest path will have buffers added to deal with the extra phases). Another way of describing the logic synchronization of the present invention is that it requires that substantially all signal paths through a device that comprises a collection of CP gates pass through the same number of clock phases.

Clocking Efficiency

Figure 9A:
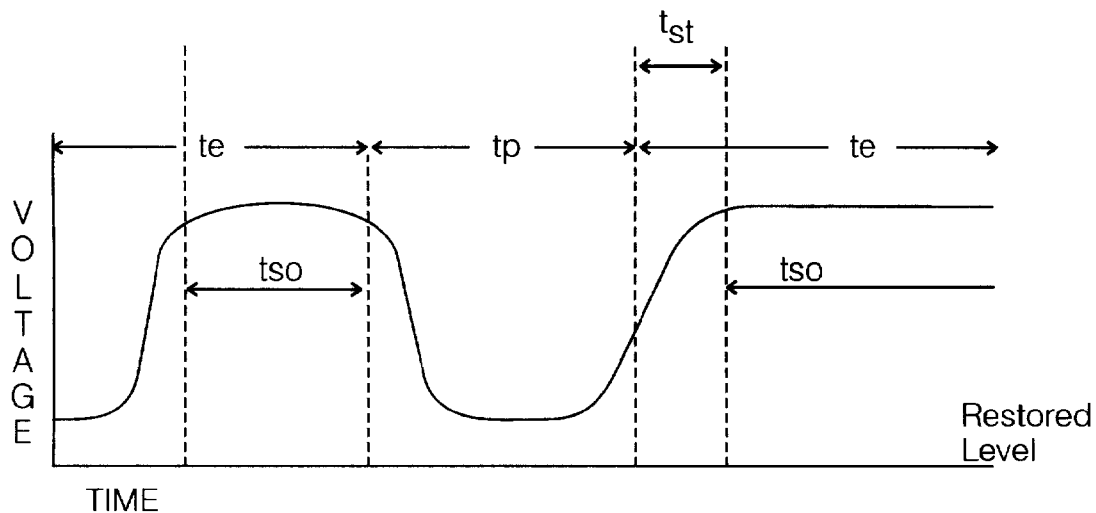
FIG. 9A illustrates the desired operating mode of a dynamic gate and FIG. 9B illustrates the operating mode of a typical dynamic gate.

Referring to FIG. 9A, one sees that a clock cycle for a single gate has four regions. There is a precharge period $t_p$ where the gate is precharged to a known logical value. Following the precharge period is a period of time where the clock switches from low high, but the inputs to the gate are not active. This period of time can be thought of as a skew-tolerance period $t_{st}$ because we are specifically designing the path so that the inputs do not become active until the gate is known to be in evaluate mode (e.g. the evaluate edge arrives sometime after the clock is guaranteed to have arrived). Next we have an evaluation period $t_e$ where the gate's inputs become active, and the gate actually evaluates. We can think of this as the time where the evaluation edge passes through the logic gate. Finally, we have an output hold-time period $t_{so}$ where the outputs are held constant until it is known that the next gate has captured their value. From here, the process starts again by precharging the gate.

Figure 9B:
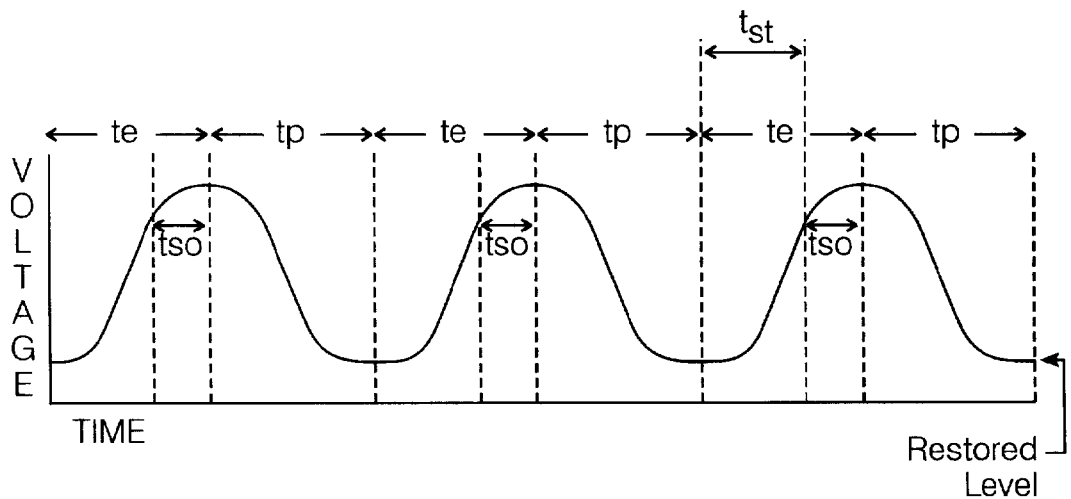

We would like to use our logic gates as efficiently as possible. This means that we would like to optimally arrange the four different phases of operation for a gate. We can calculate the amount of time required for precharge, skew-tolerance, evaluation, and hold-time for a particular logic function and then generate the right clock for these times. One important consideration in this synchronization scheme is to try to reduce the variance between the evaluate time required by logic in each phase, which reduces the size of the transition window and improves cycle time. One way to reduce this variance is to require that the logic function being performed in each phase comprise exactly the same number of gates. If there is little variance between the speeds of different gates, then any fixed number of gates can be used. It is also important to note that greater phase overlap will increase the size of the transition window, which argues for increasing the number of clock phases (and therefore reducing the number of gates per phase). Thus, the preferred embodiment of the invention has one gate per clock phase. FIG. 9B illustrates the clocking mode of the present invention when using the above design rules.

Clock Generation

There are basically two ways to generate the different clock phases in a multi-phase clocking system. The designer can generate delayed versions of a single clock or can use a phase detector to generate multiple clocks that are appropriately out of phase from the single clock. If one wants to route only a single clock, then one must build the different phases from delays of the single clock.

In the preferred embodiment of the invention, a single global "master" clock is distributed in a low-skew manner over the relevant clock domain area. The individual phases are generated for local regions by buffering and delaying the master clock. There are two primary advantages to this approach. First, skew is well controlled across the master clock because it is a single electrical node. Second, local phase clocks can be skewed intentionally with fine-grained control because each phase clock services a limited number of gates. Local phase clocks that rise in the first half of the cycle defined by the master clock are derived from the rising edge of the master clock. Phases that rise in the second half of the master clock cycle are derived from the falling edge of the master clock. In this way when the clock is stopped at least one phase clock will be in precharge. This prevents race-through.

Tuning the Transition Window

An advantage of using locally generated clocks from a global clock source is that the designer can tune each local phase clock for its specific context. This ability to tune clock delays allows for some non-uniformity in gate delay. For example, if a local phase clock is regulating a gate that has a relatively short propagation time but follows gates that have relatively long propagation times, that gate's clock arrival time can be tuned to be later than normal for that phase gate. This allows the evaluation edge of this gate to be more centered within its clock high time, allowing for more skew and jitter tolerance than would otherwise be possible. The earliest and latest arrival times of a gate's inputs is easily determined by static or dynamic timing analysis tools. Thus, the design method is to tune clock phase delays to match the gate evaluation time within the cycle. It is also important to note that the clock tuning method is not iterative. A single static or dynamic timing analysis (with an assumption that the clocks do not interfere with critical path timing) can be used to tune the clocks appropriately. This is important from a design process efficiency point of view.

There are limitations on the degree to which a design can contain non-uniform gate delays before its efficiency begins to erode. Clock tuning allows a slower gate to use some of an adjacent gate's evaluate time, but the slower gate must still precharge. Gates that evaluate more slowly tend to precharge more slowly as well. Thus, evaluation-only cycle stealing does not help a design converge towards optimal efficiency. In fact, some gates do precharge more quickly than they evaluate—generally those with complex functions and small output loads—but they are uncommon. Evaluate period overlap in an efficient design, therefore, is primarily for the purpose of tolerating clock uncertainties.

Why Are Gates Clocked?

As stated earlier, clocks are necessary to keep fast signals from going too fast, i.e., they are there to slow things down, which means they should be designed to impact fast paths as much as necessary with as little impact on slow paths as is possible. The biggest advantage of clocked-precharged logic, in this respect, is that the transistors used for synchronization are "to the side" of the logic evaluation path. In other words, there is no point where a logical operation propagates through a device that is present only for synchronization purposes. The synchronization devices instead create virtual power and ground nodes that turn the gate on and off.

Why Do Gates Need to Hold Their Outputs?

Figure 18A:
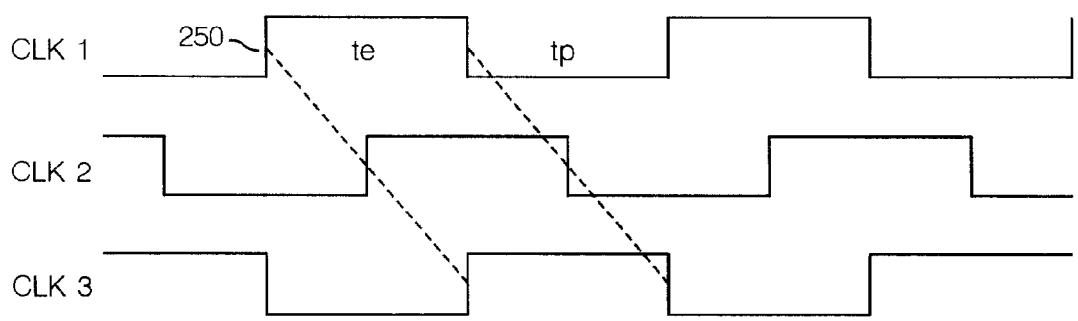
FIGS. 18A, 18B, 18C, and 18D illustrate the clocking system of the present invention.
Figure 18B:
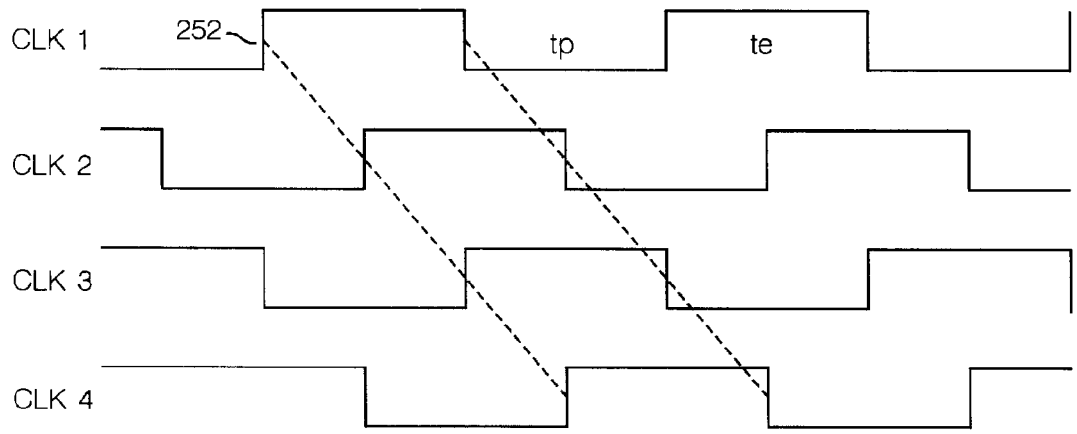
Figure 18C:
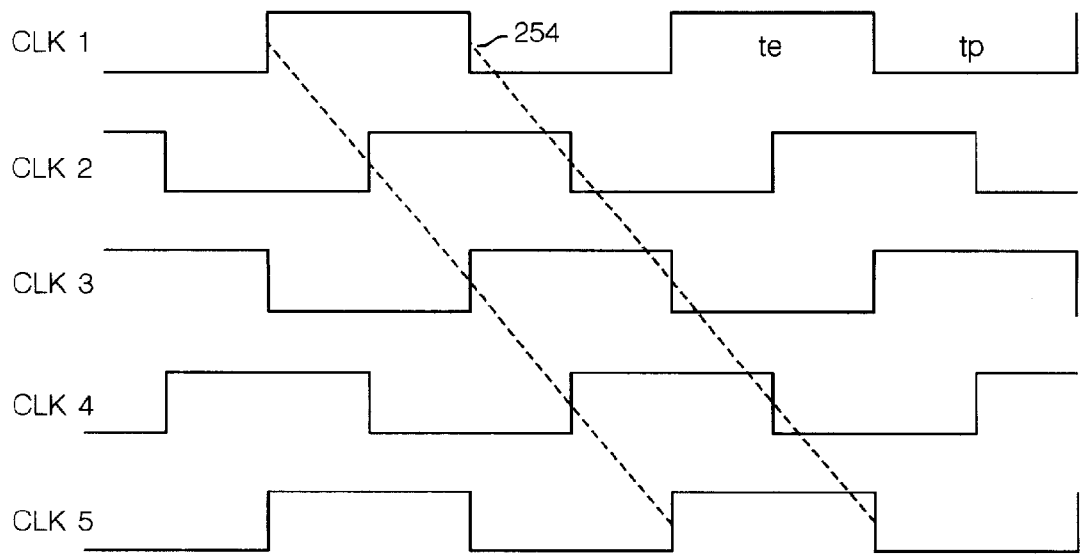
Figure 18D:
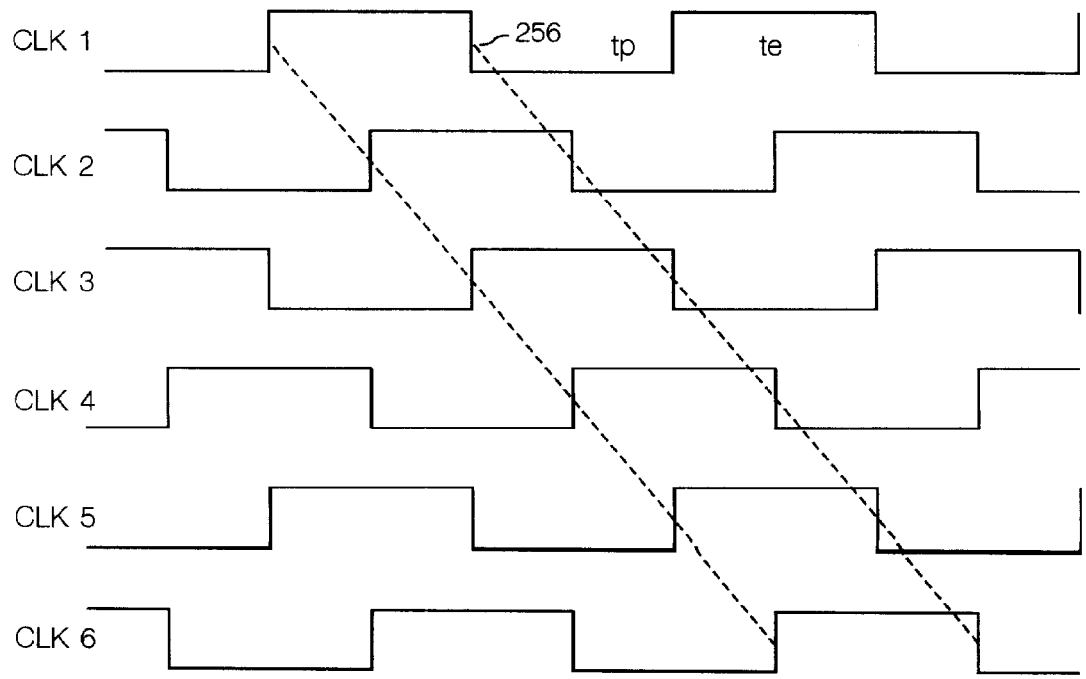

Gates must hold their outputs long enough for subsequent gates to begin their evaluation. Since there are unpredictable sources of skew, we know that it is not possible to construct a nontrivial design with just two clock phases because there is no overlap between one clock phase's evaluate period and the next clock phase's evaluate period. (The Harris paper teaches one scheme where two clocks are used, but the difficulties of tuning both fast and slow paths render it impractical for all but the simplest designs.) Three clock phases, however, provides an overlap of 1/6th of a cycle between one clock phase and the next as illustrated in FIG. 18A. FIG. 18B illustrates four clock phases, FIG. 18C illustrates five clock phases, and FIG. 18D illustrates six clock phases. As illustrated by TABLE 1, there is a direct relationship between the number of phases and the evaluation period overlap:

TABLE 1

| Number of phases | Clock period overlap |
|---|---|
| 3 | 1/6 |
| 4 | 1/4 |
| 5 | 3/10 |
| 6 | 1/3 |

The depicted clock waveforms for the different clocking strategies are all optimally balanced to allow for maximum unpredictable error tolerance, and to provide as much time borrowing as is possible. The strategy chosen should depend only on the sum of the amount of error present and the amount of time borrowing desired.

In a typical 0.18 u process, dynamic gates evaluate in 100 ps to 200 ps and can be precharged in 150 ps, which allows a gate to cycle in 300 ps to 350 ps. Clock jitter (the unpredictable error) can be controlled to within 50 ps. Therefore, if we allow for a 200 ps gate to borrow 25 ps on either side, and tolerate 50 ps of jitter on each clock edge, we require a guaranteed overlap of 50 ps between each clock domain. With the 3-phase strategy, the maximum clock period would be 450 ps (75 ps divided by 1/6th), for a peak clock rate of 2.222 GHz. The 4-phase strategy operating to similar restrictions would require 300 ps to satisfy the overlap, but four gates require at least 600 ps, so this strategy provides more jitter and time borrowing tolerance than is required at a cost of clock rate. Therefore, a three phase clock (with overlapping phases) provides a preferred solution for logic synchronization for most situations. (Three phases is the minimum number that eliminates the need to tune fast paths).

Figure 14A:
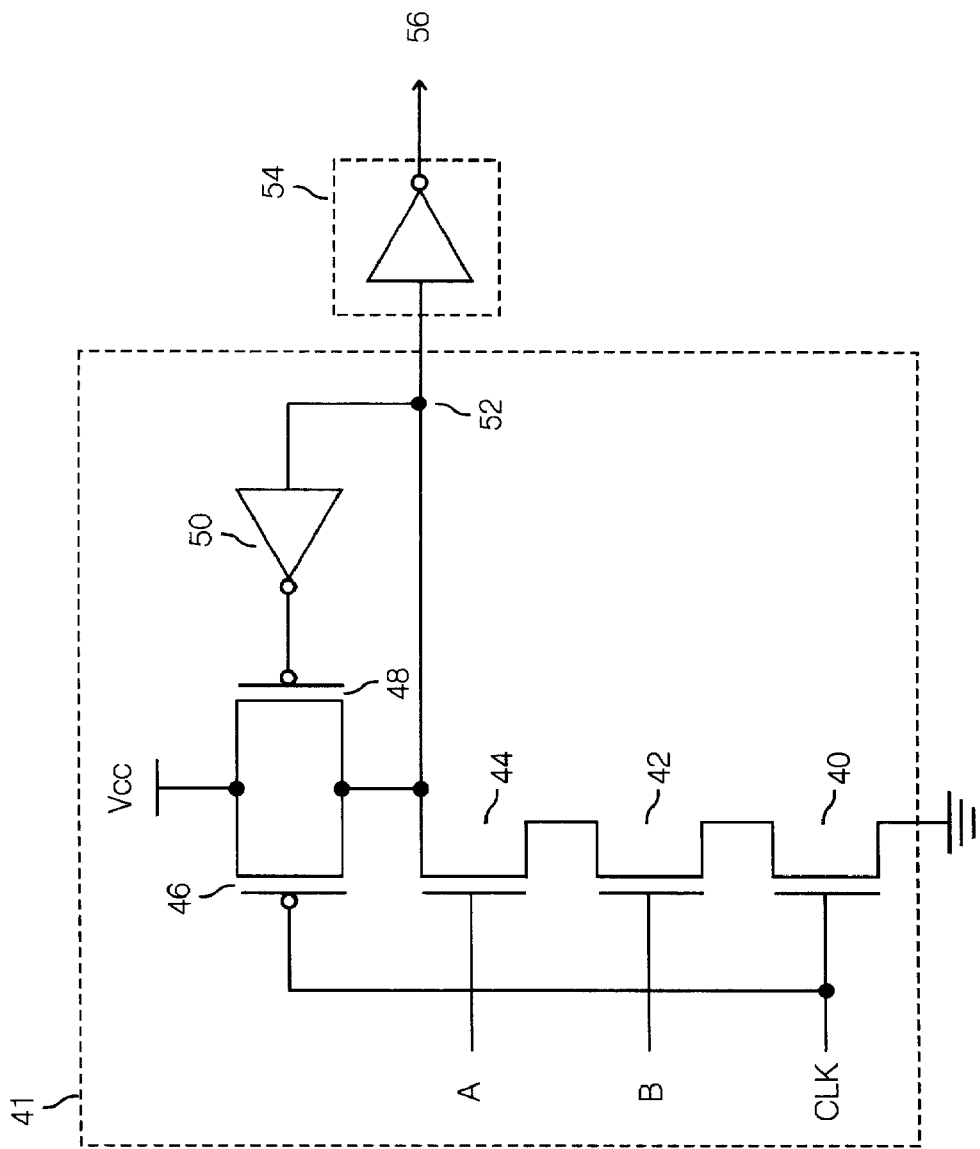
FIGS. 14A and 14B illustrate example prior art logic circuits.
Figure 14B:
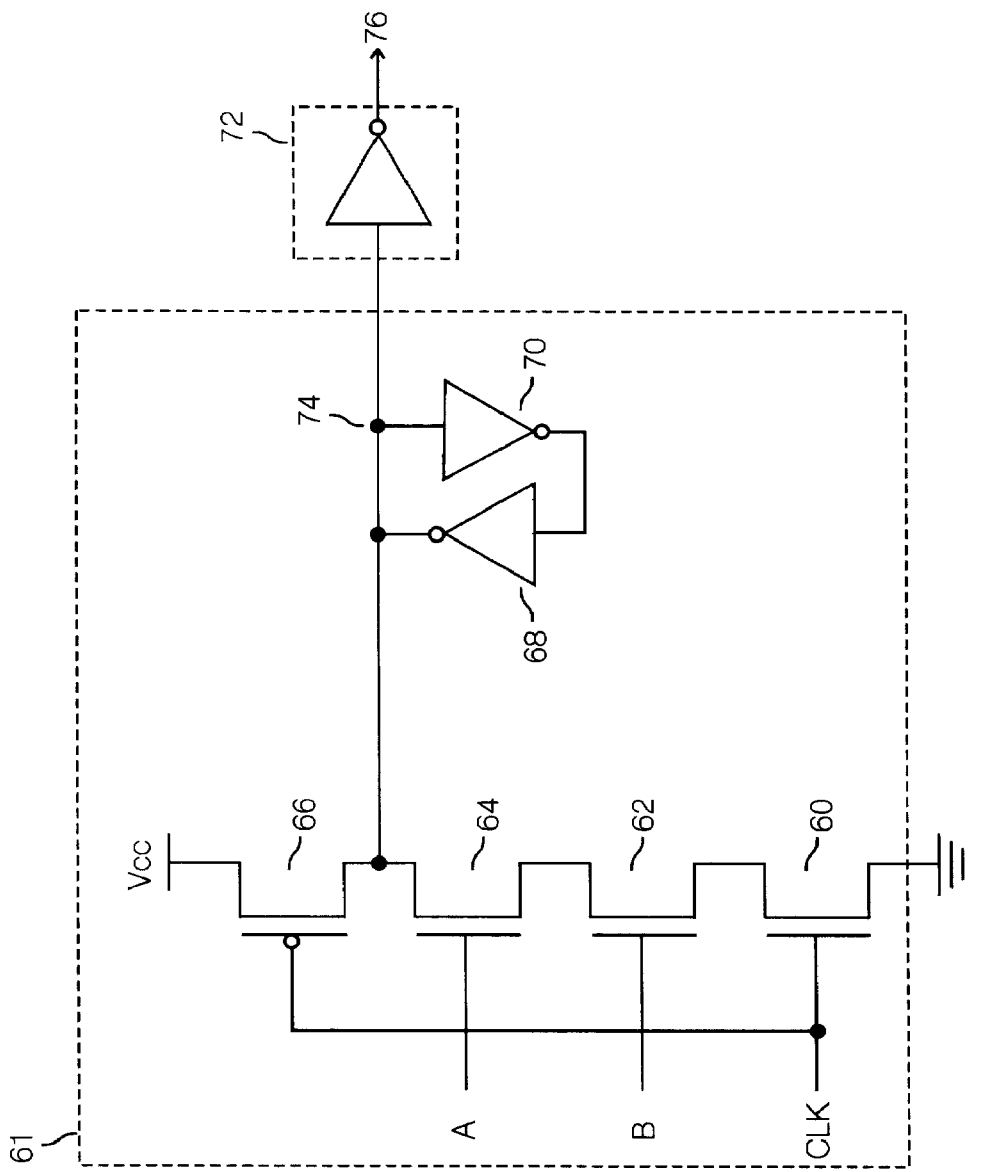
Figure 15A:
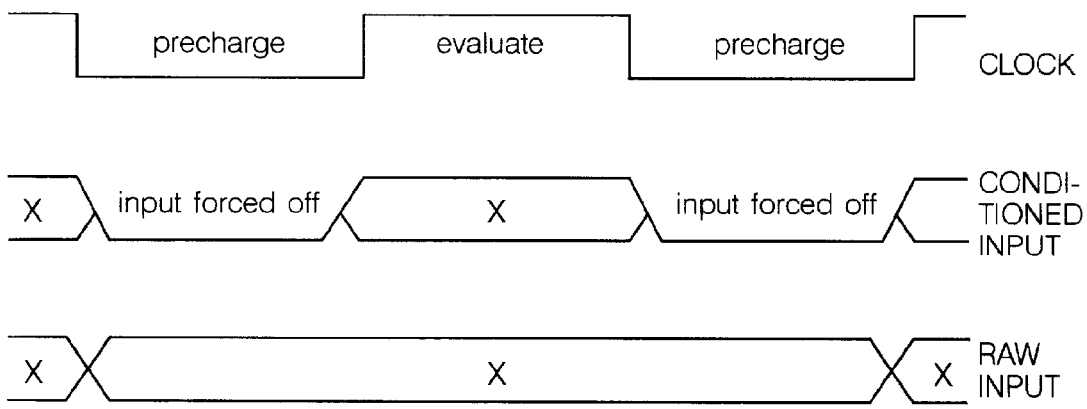
FIGS. 15A, 15B, and 15C illustrate clock conditioning for a dynamic logic gate.
Figure 15B:
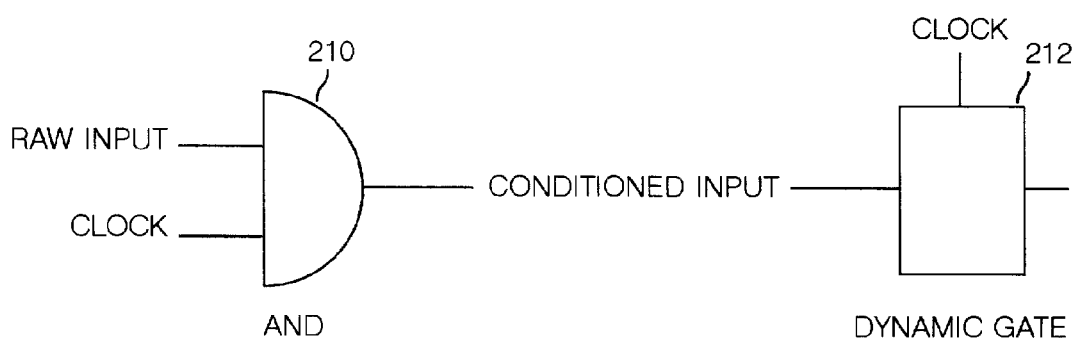
Figure 15C:
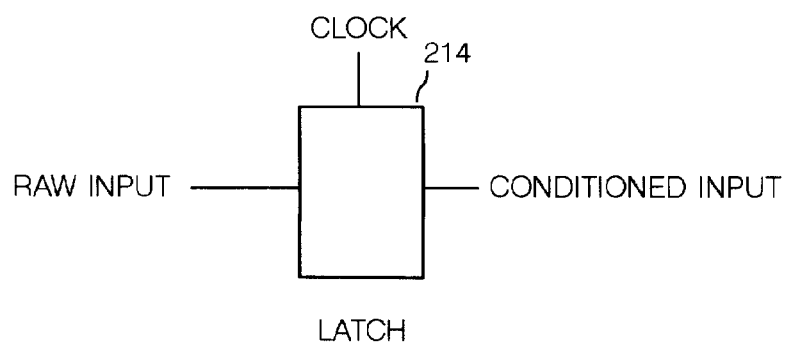
Figure 16:
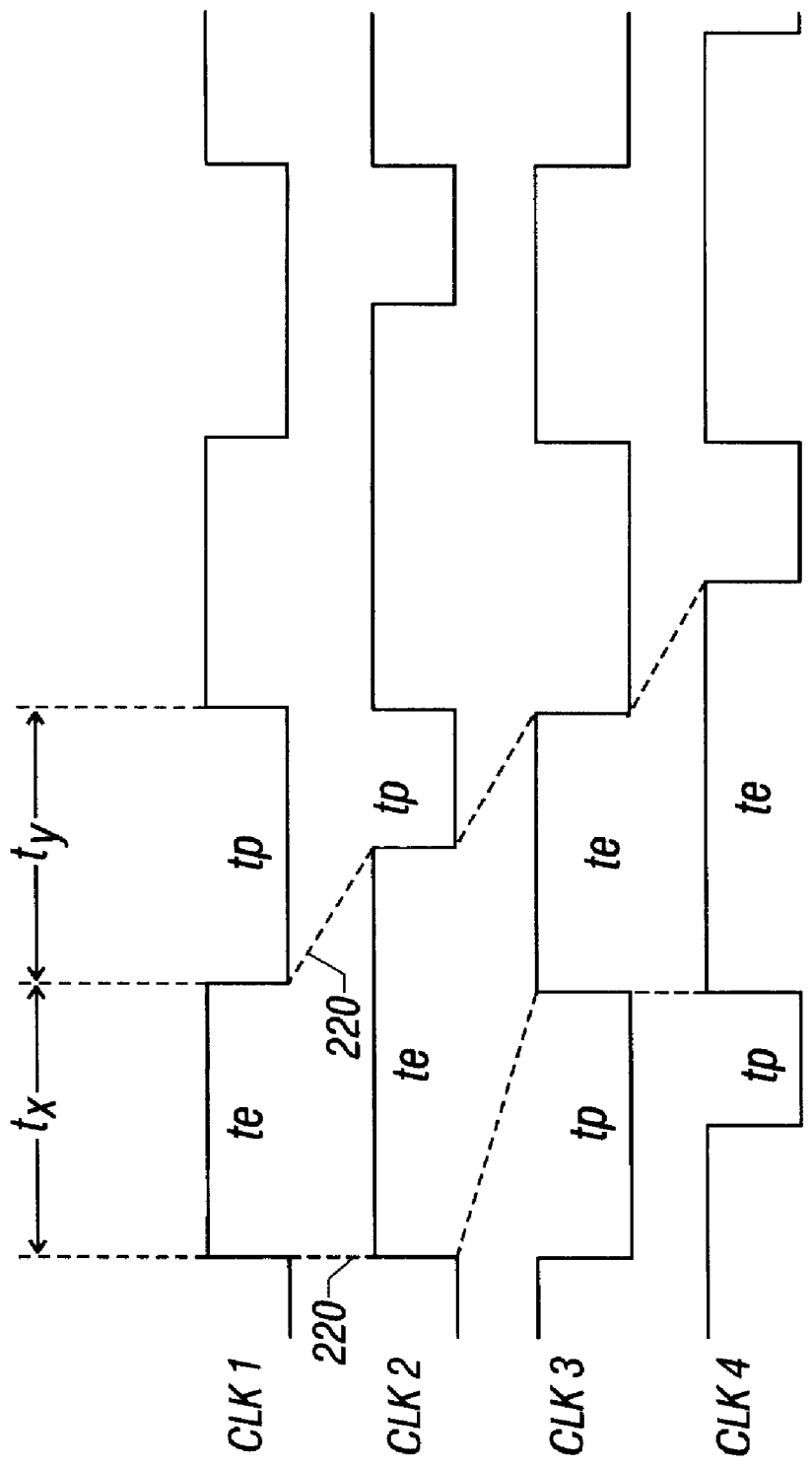
FIG. 16 illustrates a prior art 4-phase clock system.
Figure 17A:
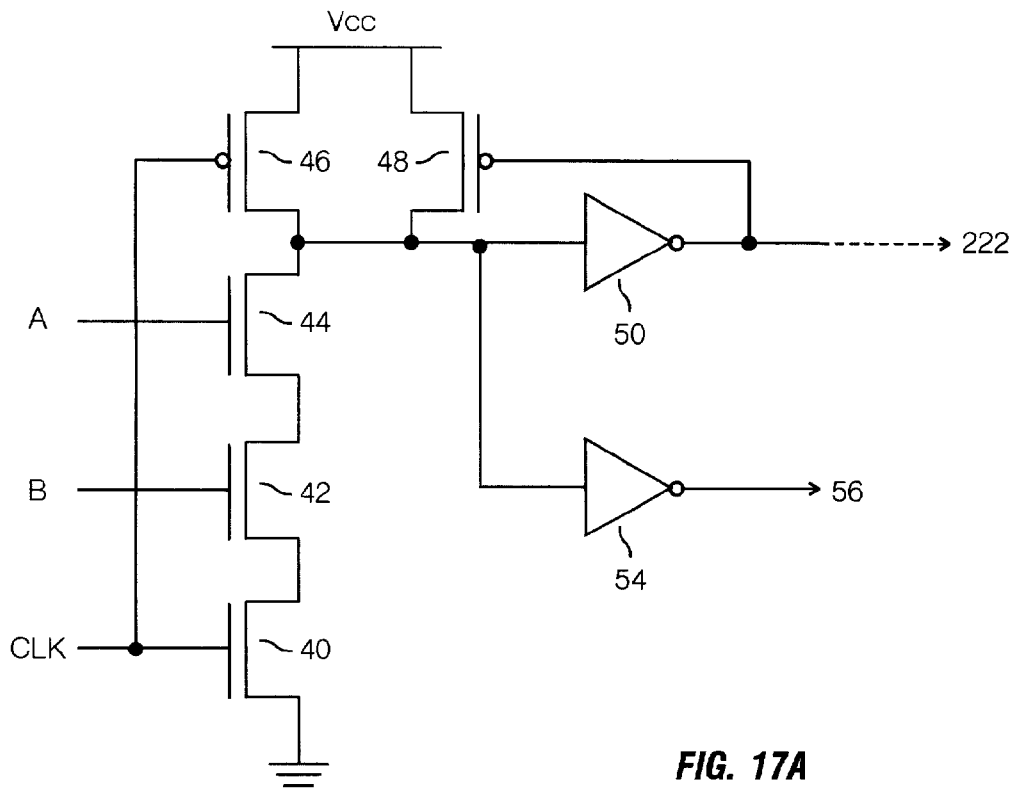
FIGS. 17A and 17B illustrate differences constructing logic gates between the prior and the present invention.
Figure 17B:
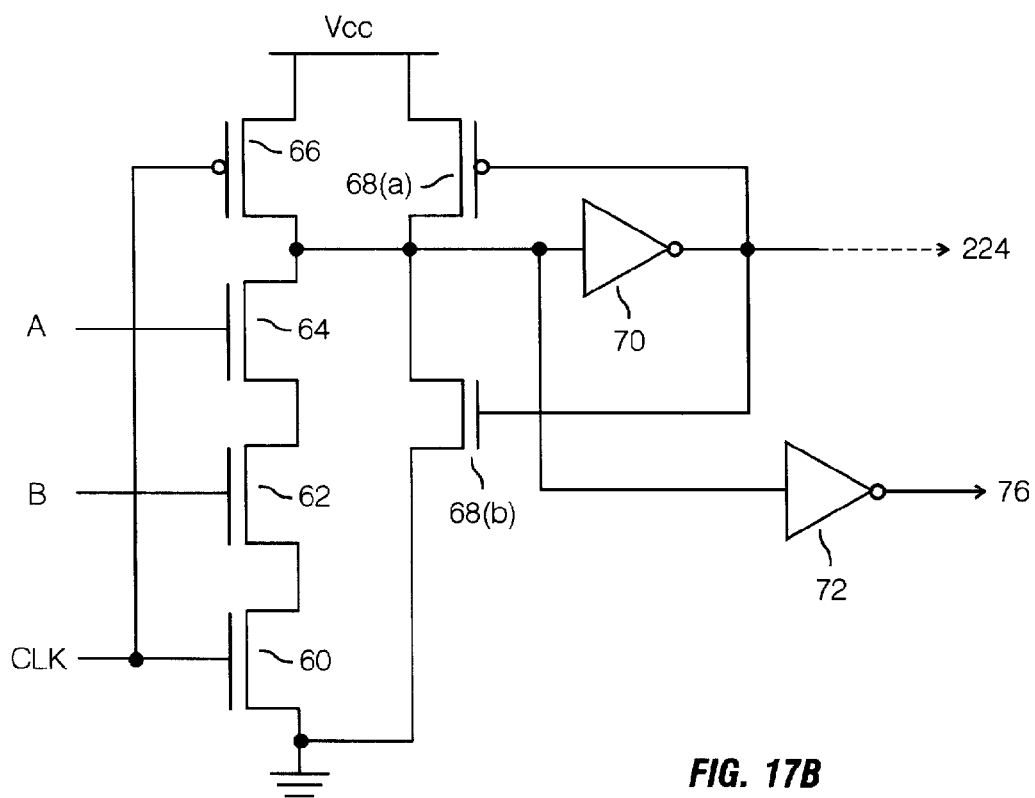

One difference between the Harris patent and other prior art and the present invention is the composition of a functional logic circuit. A logic circuit according to the present invention comprises a signal keeper device as part of the functional circuit. The prior art typically separates the logic circuit from the device that is acting as an output buffer or in a type of signal keeping capacity. The present invention, however, considers the signal keeper circuit or output buffer as part of the logic circuit. This allows the present invention to have a well controlled evaluate node where all capacitances within the circuit are well understood. Additionally, including the keeper device as part of the logic circuit allows the present invention to eliminate the need for a dedicated keeper inverter. For example, FIGS. 17A and 17B are FIGS. 14A and 14B redrawn to illustrate the elimination of the additional inverter by the present invention. In FIG. 17A, an output 222 represents the output from the circuit using the teachings from the present invention. This output in the preferred embodiment couples directly to the inputs of the next logic gate in the series. Note that under the prior art, the output signal 56 (that connects to the next logic gate in the prior art) must first travel through the additional inverter 54. Likewise in FIG. 17B, an output 224 represents the output from the circuit using the teachings from the present invention. This output in the preferred embodiment couples directly to the inputs of the next logic gate in the series. Again, note that under the prior art, the output signal 76 must first travel through the additional inverter 72. In this figure, the additional inverter 68 from FIG. 14B is redrawn to be more similar to the full signal keeper as described in the present invention.

Static Interface

No design can be entirely dynamic. Sooner or later a dynamic gate must communicate with existing hardware, virtually all of which uses static logic. Converting signals from static to dynamic requires a time reference point. This is because a dynamic signal communicates both state information and whether that state information is valid. A static signal only communicates state information, and must rely on an external time reference to indicate when the state information is valid. Therefore, creating a proper dynamic signal requires adding validation information (from a clock) to state information from the static signal.

When a dynamic gate is in its evaluate phase, its inputs must arrive before the end of the evaluate phase. Furthermore, its inputs must not be transitioning from an asserted to a precharged state during this period. Stated another way, when a gate is evaluating, its inputs must be asserted, not-asserted, or transitioning from a not-asserted to an asserted state, and NOT transitioning from an asserted to a not-asserted state.

Static signals may switch multiple times before attaining their final, valid values during a cycle. Also, a static signal encodes information using its voltage level (generally, a high voltage indicates a logic one and a low voltage indicates a logic zero). These two properties of static logic cause problems when static logic interfaces with CP logic.

Both problems are related to the fact that CP logic gates cannot recover their precharge state during the evaluate phase. Thus, if a static input to a CP gate goes temporarily high during the CP gate's evaluate phase before eventually going to a low level, the CP gate will incorrectly switch in response to the transitory and invalid high level of the static signal.

In order to avoid this, the static signal must be controlled so that it does not incorrectly transition high during the CP gate evaluate phase. This can be done by latching the static signal before the CP gate in such a way that the CP gate input is stable through the evaluate phase.

Since CP gates do not provide an inverting function, it is generally necessary to provide a latched inverted version of the static signal as well as the positive version.

Clocking Devices

Dynamic gates may include signal keepers as discussed previously. Since a designer wants to allow inputs to dynamic gates to disappear before the end of a dynamic gate's evaluate period, there is the possibility that the evaluate stack of the gate will not provide a path to ground for the internal evaluate node for a portion of time. When this occurs, the evaluate node is completely cut off from either power or ground, and will drift from its desired voltage level. For a gate that evaluated true (discharged its evaluate node), the voltage may drift high. Furthermore, when a gate is in its evaluate phase the inputs may NOT be true, which means the evaluate node should not discharge. In this case, there is no path to ground to discharge the node, but there is not a path to power to hold the node high (the node is not precharging). Therefore, the node might drift low.

Some dynamic logic styles assume that the inputs are present for the total duration of the evaluate periods such as described in the Harris patent, which calls this dynamic logic style "domino" logic. Domino is the arrangement of dynamic gates in series where all gates are precharged at once, and then all gates are evaluated at once. Inputs are provided to the first gates in the series when they are in the evaluate phase, and the evaluate nodes begin to "topple," just as a series of dominos that have been stood on end. In this configuration the inputs to each dynamic gate ARE valid through their entire evaluate phase. (Note that the term "domino" has been badly used in the art, often referring to any dynamic gate. In fact, "domino" refers to one of the first popularized clocking strategies of dynamic gates). When the inputs are valid (either low, high, or low-to-high transitioning), then there is no need for the N-channel signal keeper. The N-channel keeper would be required only to hold the input low after a previously true input had departed. Therefore, there must have been a high-to-low transition.

The clocking strategy described in the present invention is unlike that of domino logic. Instead of standing all the dominos on end and then knocking the first in the series down, the present invention stands each domino back up right after it has knocked its neighbor down. It is more appropriate to refer to this as wave clocking rather than domino clocking because if one could view dominos behaving this way they would appear to propagate their "topple" pattern as "waves." With this clocking strategy, all signals propagate through one and only one gate corresponding to each clock phase. Inaccuracies in the clocks themselves due to jitter are tolerated because of the substantial overlap of the evaluate periods of each pair of adjacent gates. These overlaps represent a corridor of time, the "wave," through which signals must propagate. If the signals arrive early to a gate, the signals will simply be delayed in starting through that gate until its evaluate clock period.

A summary of some of the elements of the preferred embodiment of the present invention is that all paths must go through the same number of levels of logic, because each clock phase gate must receive its inputs only from gates of the preceding clock phase. Additionally, with few if any exceptions all signals are dynamic in order to avoid the synchronization penalty incurred at dynamic-static interfaces. The present invention avoids the use of latches, registers and flip-flops that further reduces synchronization penalties. And, feedback paths and feedforward paths must skip an integer multiple number of gates equal to the number of clock phases in the clocking strategy.

Figure 10B:
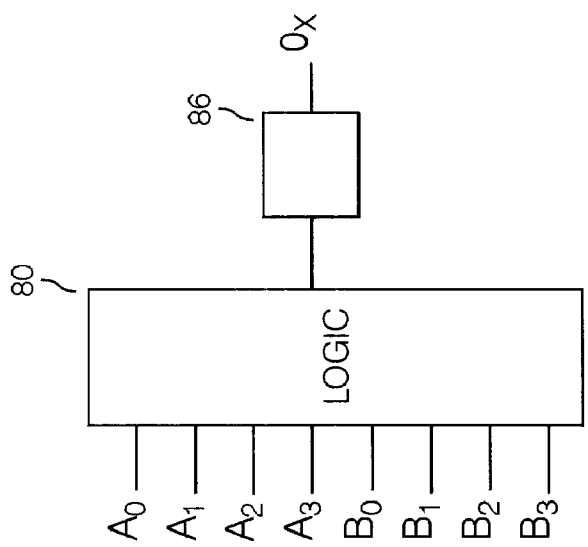
FIGS. 10A and 10B illustrate 1 of 4 logic circuits used in the present invention.
Figure 10A:
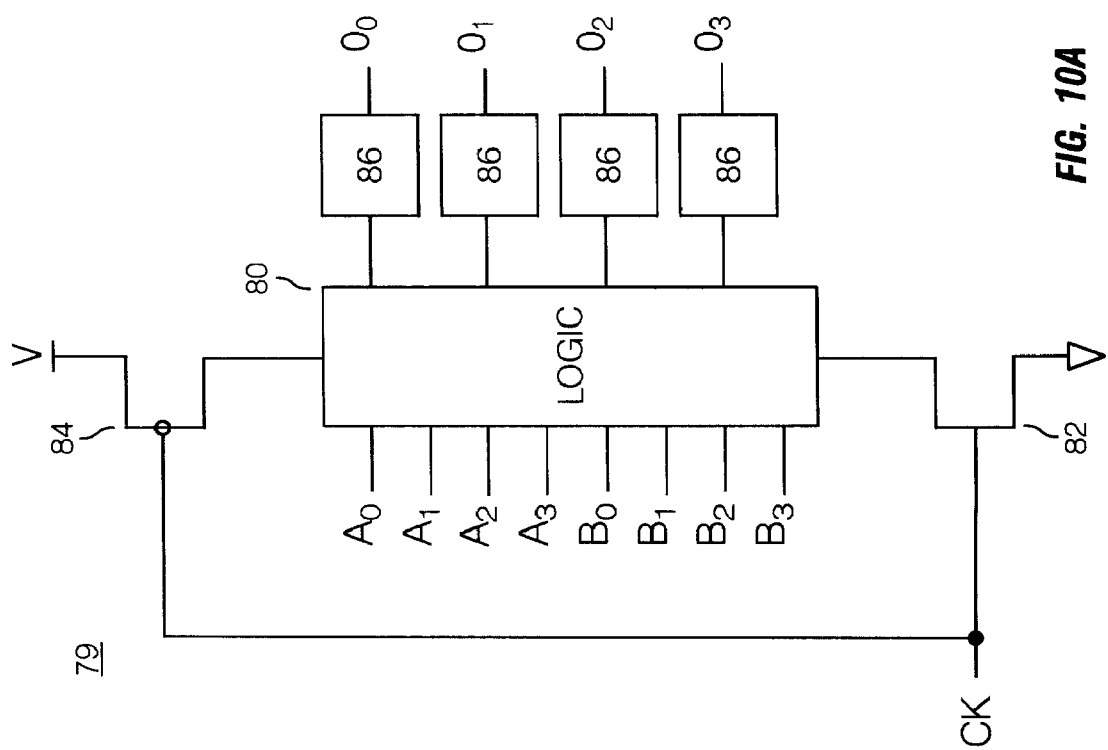
Figure 11B:
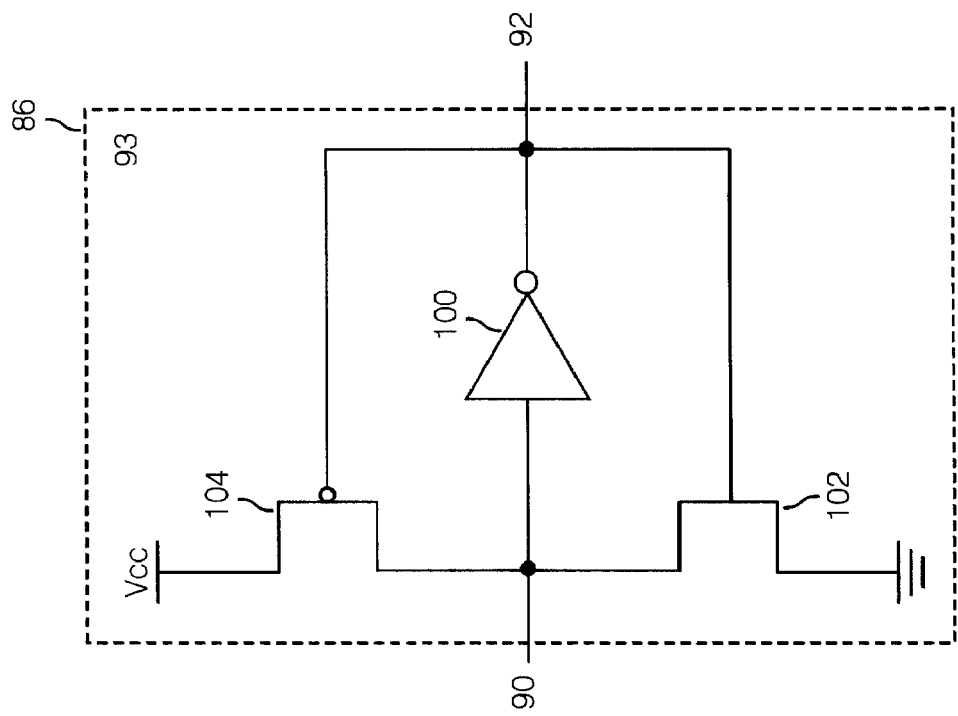
FIGS. 11A and 11B illustrate the different signal keeper devices of the present invention.
Figure 11A:
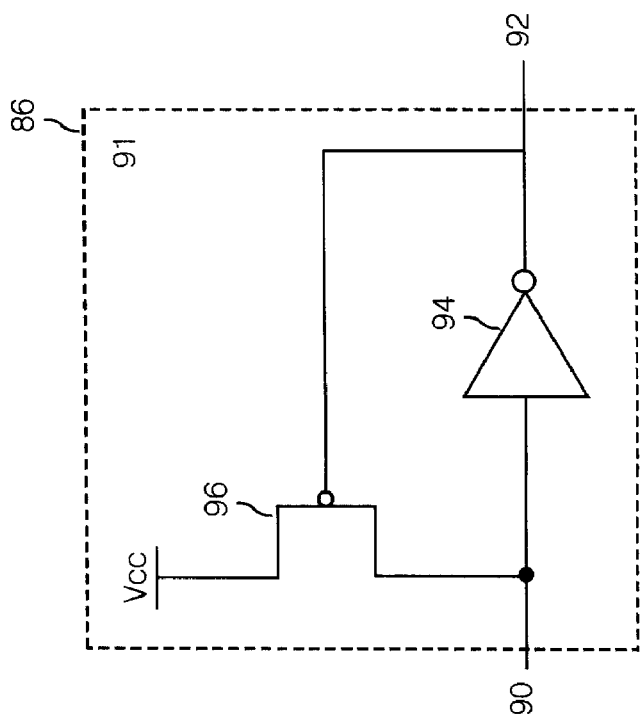
Figure 12:
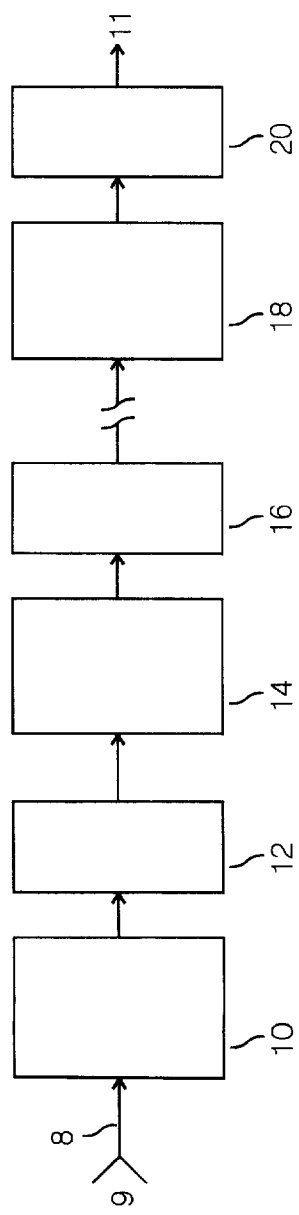
FIG. 12 is an example pipeline in an integrated circuit.
Figure 13:
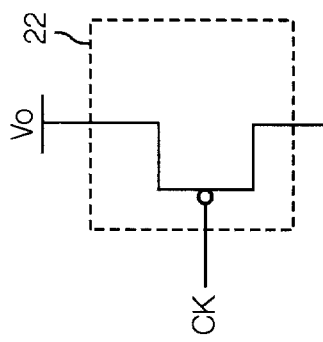
FIG. 13 illustrates an example prior art logic circuit.
Figure 13:
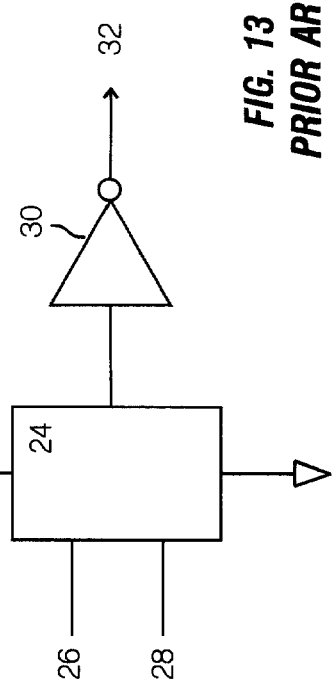
Figure 20:
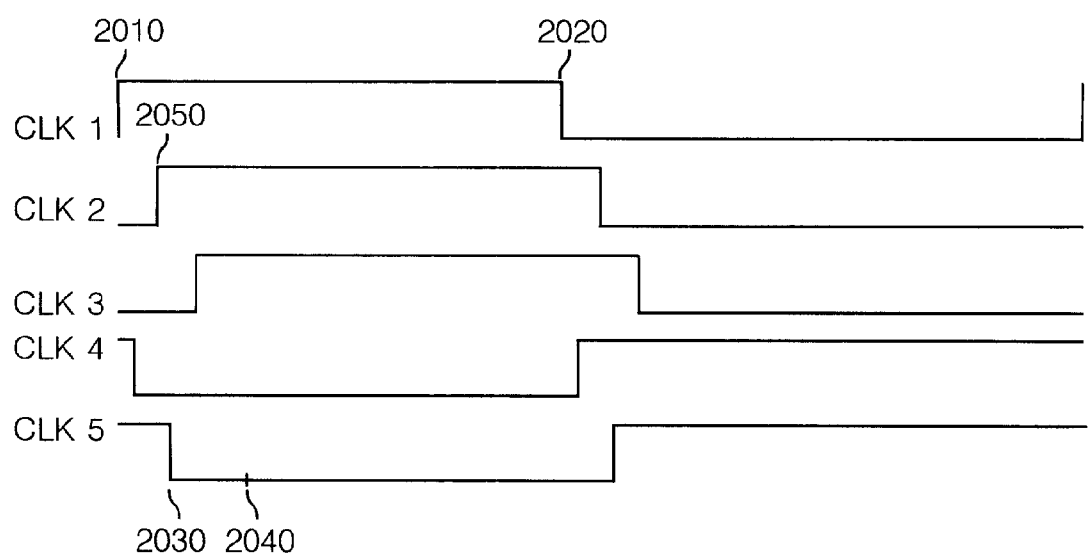
FIG. 20 illustrates the 5 phase clock system of FIG. 18C operating at a low frequency.

An important difference between the present invention and domino logic is that the inputs to one dynamic gate in the present invention will go away before the next dynamic gate in the series has completed its evaluate period. Therefore, it is possible to get a high-to-low transition on an input to a evaluating gate. This is acceptable because the signal was correct when it was high and the dynamic gate is simply done with propagating its information to the next gate, and now the gate needs to start precharging in earnest to get ready for the next evaluate phase. However, since the gate can transition from high-to-low, it is possible to encounter the condition where an evaluate node has been discharged, but has nothing to hold it discharged during low frequency operation or when the clock is stopped. Therefore, a signal keeper is necessary. This is why the present invention requires a signal keeper as part of the logic circuit as illustrated in FIGS. 10A, 11A, and 11B. If not for the signal keeper, then the dynamic node of the CP logic device, which is floating during the low frequency operation or when the clock is stopped, will drift to an unknown voltage level. FIG. 20 illustrates the problems encountered in a low frequency operation by showing a 5 phase clock system such as illustrated in FIG. 18C but that is operating at ⅒th the clock speed. Reference 2010 to 2020 shows when CLK0 is in the evaluation period. Reference 2030 shows the falling edge of CLK5. ClK5 is in precharge 2040 until after CLK1 goes out of evaluation at 2020 and into precharge. Due to the length of time CLK1 is in evaluation, its dynamic node will drift to an unknown voltage level.

FIGS. 18A, 18B, 18C, and 18D illustrate the clocking system of the present invention. In the figures, $t_e$ is the evaluate phase of the clock cycle, and $t_p$ is the precharge phase of the clock cycle. Additionally, each individual clock has a 50% duty cycle. The phases of the different clocks are such that the phase of an individual clock signal overlaps the phase of an earlier clock signal by an amount equal to the overlap of the phase of the next clock signal. Additionally, the overlapping clock phases occur in such a way that two or more clocks signals are overlapping in their evaluate phases at any point in time. FIG. 18A illustrates a three phase clocking system with clocks CLK1, CLK2, and CLK3. Reference 250 illustrates the propagation of the "wave" of the evaluate cycles of the different clocks. FIG. 18B illustrates a four phase clocking system with clocks CLK1, CLK2, CLK3, and CLK4. Reference 252 illustrates the propagation of the "wave" of the evaluate cycles of the different clocks. FIG. 18C illustrates a five phase clocking system with clocks CLK1, CLK2, CLK3, CLK4, and CLK5. Reference 254 illustrates the propagation of the "wave" of the evaluate cycles of the different clocks. And, FIG. 18D illustrates a six phase clocking system with clocks CLK1, CLK2, CLK3, CLK4, CLK5, and CLK6. Reference 256 illustrates the propagation of the "wave" of the evaluate cycles of the different clocks.

A design using the preferred embodiment of the present invention will operate at a high enough clock speed so that the evaluate nodes will not have time to drift. For example, at 2 GHz the period of time where an evaluate node will be not held high is only 250 ps, and the period of time where it will not be held low is even less, since it must have first been pulled low. Signal keepers help to some degree with noise immunity, which is a particularly important problem when there is a significant noise issue with an evaluate node. As discussed in the Harris patent, the suggestion is that evaluate nodes can be long wires since the evaluate node itself is used as the output. When this occurs there can be a large coupling component which increases the need for keeper transistors in gates. The present invention, however, requires that evaluate nodes be kept entirely within logic gates. This reduces the coupling effect to the point where an additional signal keeper on the signal as found in the Harris patent and other prior art is not necessary.

FIGS. 19A, 19B, 19C, and 19D illustrate pipeline designs in integrated circuits using the logic synchronization system of the present invention. The preferred embodiment of the present invention provides that an individual logic circuit receive its input from an earlier logic circuit in the series and passes it to the next logic circuit in the series. The earlier logic circuit couples to an earlier phase clock signal, and the next logic circuit in the series couples to the next phase clock signal. The preferred embodiment of the present invention additionally provides that a logic circuit may only feed another logic circuit in a feed back loop or a feed forward loop that uses the next phase clock signal.

Figure 19A:
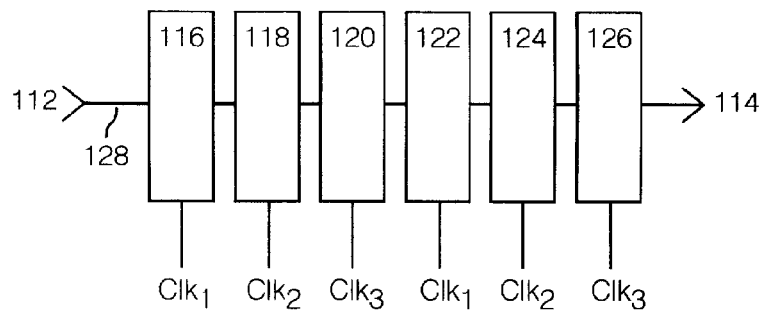
FIGS. 19A, 19B, 19C and 19D illustrate the pipelining of logic circuits with the present invention.

FIG. 19A illustrates a pipeline 110 in an integrated circuit using the three phase clocking system with the clocks CLK1, CLK2, and CLK3, as illustrated in FIG. 18A. The pipeline 130 comprises a data path 128, an input signal 112, and an output signal 114. The data path 128 comprises one or more wires to propagate the signals through the pipeline. For example, the data path 128 may comprise one or more N-nary signals. Additionally, the input signal 112 and the output signal 114 may comprise signals using N-nary encoding. The pipeline 110 comprises the logic circuits 116, 118, 120, 122, 124, and 126 coupled in series to the data path 128. The logic circuits may comprise N-nary logic circuits. Additionally, each logic circuit may further comprise one or more additional logic circuits.

Figure 19B:
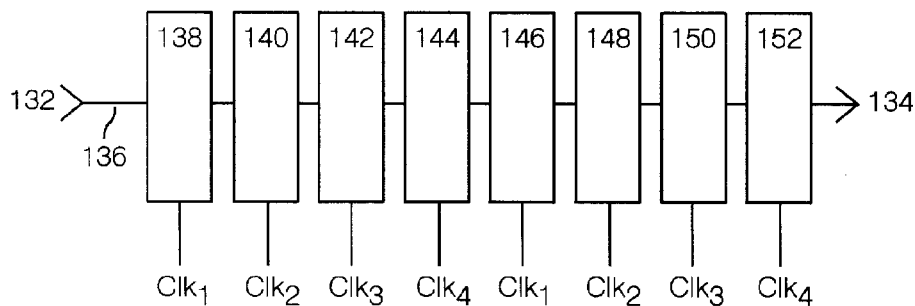

FIG. 19B illustrates a pipeline 130 in an integrated circuit using the four phase clocking system with the clocks CLK1, CLK2, CLK3, and CLK4, as illustrated in FIG. 18B. The pipeline 130 comprises a data path 136, an input signal 132, and an output signal 134. The datapath 130 comprises one or more wires to propagate the signals through the pipeline. For example, the datapath 130 may comprise one or more N-nary signals. Additionally, the input signal 132 and the output signal 134 may comprise signals using N-nary encoding. The pipeline 130 comprises the logic circuits 138, 140, 142, 144, 146, 148, 150, and 152 coupled in series to the datapath 136. The logic circuits may comprise N-nary logic circuits. Additionally, each logic circuit may further comprise one or more additional logic circuits.

Figure 19C:
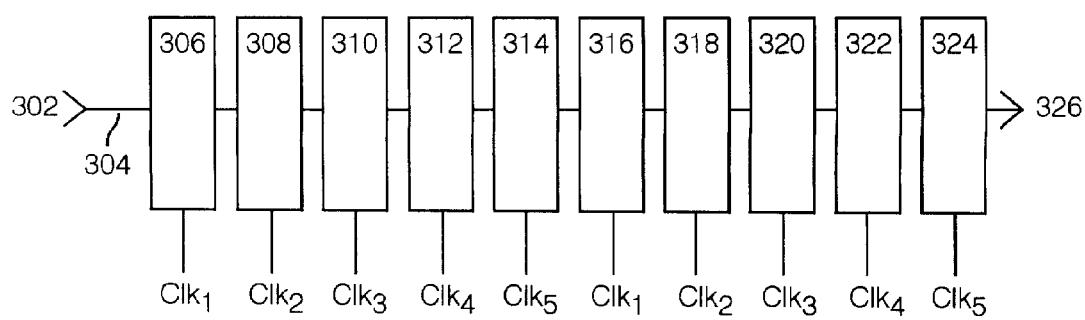

FIG. 19C illustrates a pipeline 300 in an integrated circuit using the five phase clocking system with the clocks CLK1, CLK2, CLK3, CLK4, and CLK5, as illustrated in FIG. 18C. The pipeline 300 comprises a datapath 304, an input signal 302, and an output signal 326. The datapath 304 comprises one or more wires to propagate the signals through the pipeline. For example, the datapath 304 may comprise one or more N-nary signals. Additionally, the input signal 302 and the output signal 326 may comprise signals using N-nary encoding. The pipeline 300 comprises the logic circuits 306, 308, 310, 312, 314, 316, 318, 320, 322, and 324 coupled in series to the datapath 304. The logic circuits may comprise N-nary logic circuits. Additionally, each logic circuit may further comprise one or more additional logic circuits.

Figure 19D:
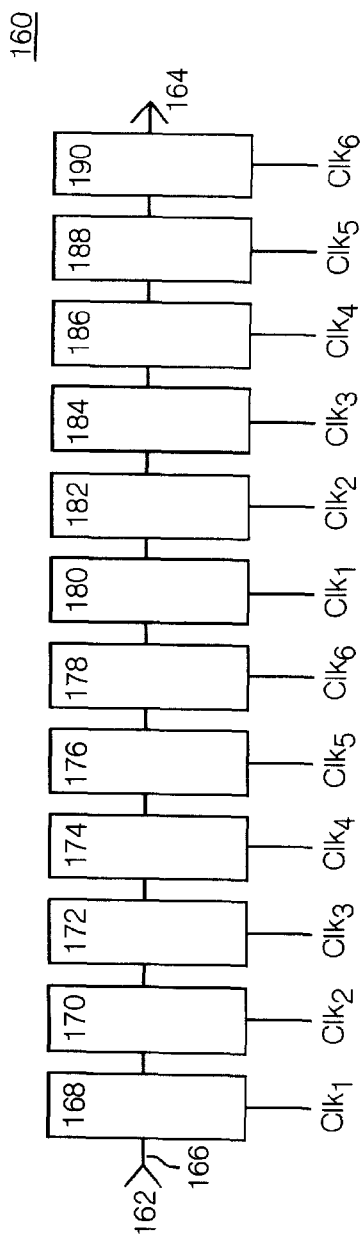

FIG. 19D illustrates a pipeline 160 in an integrated circuit using the six phase clocking system with the clocks CLK1, CLK2, CLK3, CLK4, CLK5, and CLK6, as illustrated in FIG. 18D. The pipeline 160 comprises a datapath 166, an input signal 162, and an output signal 164. The datapath 166 comprises one or more wires to propagate the signals through the pipeline. For example, the datapath 166 may comprise one or more N-nary signals. Additionally, the input signal 162 and the output signal 264 may comprise signals using N-nary encoding. The pipeline 166 comprises the logic circuits 168, 170, 172, 174, 176, 178, 180, 182, 184, 186, 188, and 190 coupled in series to the datapath 166. The logic circuits may comprise N-nary logic circuits. Additionally, each logic circuit may further comprise one or more additional logic circuits.

Figure 19E:
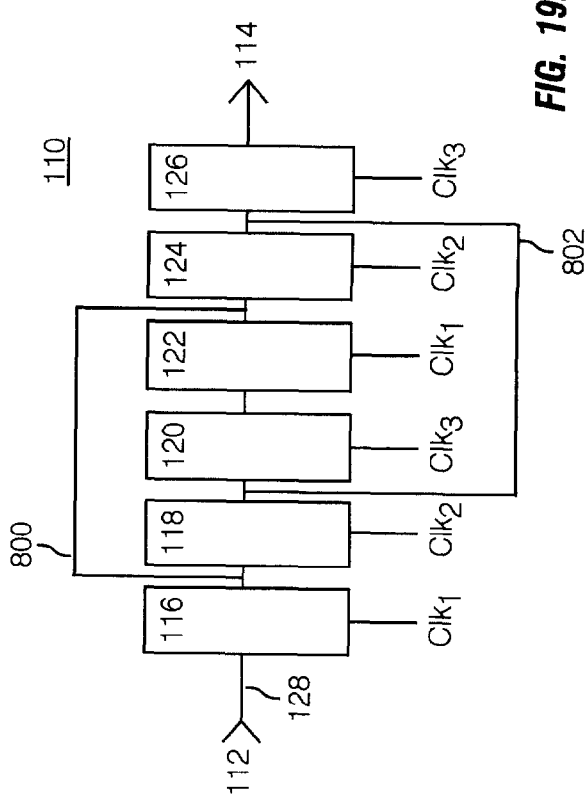

FIG. 19E illustrates feedback and feedforward loops with the pipeline 110 of FIG. 19A. Logic circuit 122 with a CLK1 signal may only communicate with a logic gate with a CLK2 signal, which is either logic gate 124 (coupled to serially in the pipeline 110) or logic gate 118 through feedback loop 800. And, logic circuit 118 with a CLK2 signal may only communicate with a logic gate with a CLK3 signal, which is either logic gate 120 (coupled to serially in the pipeline 110) or logic gate 126 through feedforward loop 802.

Stopping the Clock

A final aspect of the present invention is the effect that stopping the clock has on the logic circuits. When stopping clocks, it is necessary to stop them either in a high state or a low state. When clocks are stopped, some gates in a sequence of dynamic gates will be stopped in their precharge state and some in their evaluate state. When we stop a gate in its evaluate state, the gate's inputs may not be present if the preceding gate is stopped in its precharge state, therefore this gate requires an N-channel keeper. Additionally, a gate's inputs when stopped may result in a logical zero output (the case where the N-stack is off), which requires this gate to need a P-channel keeper. Keeper's in the present invention come in two styles, a full keeper or a half-keeper, as illustrated in FIGS. 11A and 11B. Therefore, if one needs to see the output of evaluated gates when stopping clocks, the integrated circuit must include full keepers in the critical path of the series of logic circuits.

During manufacturing test, clocks are stopped in both the high and low states to test the circuit for low-level current leakage. This type of testing is commonly known as IDDQ testing and is used to test for latent defects and to improve the outgoing quality and reliability of circuit products. The simple observation is that every gate may be stopped in evaluate, and therefore every gate requires a full keeper. However, it is not necessary for all gates in the series of logic gates to contain full keepers. If a designer ensures that the first evaluated gate in a series has a full keeper, and then the gates that are in the evaluate phases are stopped, the remaining evaluate gates will have their inputs held true just as in the domino clocking strategy. Note that this is greatly simplified by the logic synchronization style of the present invention where each clock phase must feed the next, and only the next clock phase.

Hardware emulation and scan testing are other functions that benefit greatly from the ability to stop the clocks and have the circuit hold its state. In both applications, it is desirable or even necessary that the clocks can be stopped and valid circuit state be inspected and/or modified. The present invention allows this to occur and further allows the clocks to be restarted without disturbing the operation of the circuit.

To illustrate clock stopping, a six-phase design is considered where three clocks are generated according to the global clock signal and three clocks are generated according to the inverse of the global clock signal. A series of logic gates will have logic gates in Precharge (P) or Evaluate (E) in one of the following six configurations depending on where in the cycle the observation occurs:

TABLE 2

| Phase 0 | Phase 1 | Phase 2 | Phase 3 | Phase 4 | Phase 5 |
|---------|---------|---------|---------|---------|---------|
| P | P | P | E | E | E |
| E | P | P | P | E | E |
| E | E | P | P | P | E |
| E | E | E | P | P | P |
| P | E | E | E | P | P |
| P | P | E | E | E | P |

Since phases 0–2 are derived from the positive clock signal and phases 3–5 are derived from the inverse clock signal, the clocks can be stopped in either of these states:

TABLE 3

| Phase 0 | Phase 1 | Phase 2 | Phase 3 | Phase 4 | Phase 5 |
|---------|---------|---------|---------|---------|---------|
| P | P | P | E | E | E |
| E | E | E | P | P | P |

The other 4 states shown in table 2 are transitory and do not persist when the clocks are stopped. Therefore, at a minimum, logic gates in the phase 0 clock and phase 3 clock would require full keepers while logic gates in the other phases may use half keepers.

To summarize, the present invention is a method and apparatus that synchronizes logic in an integrated circuit (IC). The present invention comprises a global clock signal with a global phase and an approximately 50% duty cycle. Additionally, the present invention comprises a first local clock signal with a first phase and an approximately 50% dutycycle that couples to a first dynamic logic gate where the first local clock signal is generated from the global clock signal. Also, one or more intermediate local clock signals with one or more intermediate phases are generated from the global clock signal where each intermediate local clock signal has an approximately 50% duty cycle that couples to one or more intermediate dynamic logic gates. And, an end local clock signal with an end phase and an approximately 50% duty cycle that is also generated from the global clock signal and that couples to an end dynamic logic gate. The phase of an individual local clock signal overlaps an earlier phase local clock signal by an amount approximately equal to the overlap of the phase of the next individual local clock signal. The first dynamic logic gate, the intermediate dynamic logic gate(s), and the last dynamic logic gates couple such that an individual dynamic logic gate with an individual local clock signal and phase may only provide a signal to the next individual dynamic logic gate that uses a next phase local clock signal where the gates may couple together in series, in a feed back loop, or a feed forward loop.

One embodiment of the present invention provides that the first local clock signal, the intermediate local clock signal(s), and the end local clock signal overlap in such a way that two or more of the first, intermediate, or end local clock signals overlap in their evaluate phase at any point in time. Another embodiment of the present invention provides that a dynamic logic gate has one gate delay per clock phase. Another embodiment of the present invention uses a clocked precharge logic gate. And finally, another embodiment of the present invention provides that the first, intermediate, or end dynamic logic gates couple to each other or to other dynamic logic gates without additional buffers, registers, latches, or static circuits.

Other embodiments of the invention will be apparent to those skilled in the art after considering this specification or practicing the disclosed invention. The specification and examples above are exemplary only, with the true scope of the invention being indicated by the following claims.

We claim the following invention:

1. An integrated circuit (IC) with synchronized logic, comprising:
    a global clock signal with a global phase and an approximately 50% duty cycle;
    a first local clock signal with a first phase and an approximately 50% duty cycle that couples to a first dynamic logic gate, said first local clock signal is generated from said global clock signal;
    one or more intermediate local clock signals with one or more intermediate phases, each said intermediate local clock signal with an approximately 50% duty cycle that couple to one or more intermediate dynamic logic gates, said intermediate local clock signals are generated from said global clock signal;
    an end local clock signal with an end phase and an approximately 50% duty cycle that couples to an end dynamic logic gate, said end local clock signal is generated from said global clock signal;
    the phase of an individual local clock signal overlaps an earlier phase local clock signal by an amount approximately equal to the overlap of the phase of the next individual local clock signal; and
    said first dynamic logic gate, intermediate dynamic logic gate(s), and last dynamic logic gates couple such that an individual dynamic logic gate with said individual local clock signal and phase may only provide a signal to the next individual dynamic logic gate that uses a next phase local clock signal wherein the gates may couple together in series, in a feed back loop, or a feed forward loop, and said first, intermediate, or end dynamic logic gates couple to each other or to other dynamic logic gates without additional buffers, registers, latches, or static circuits.

2. The IC of claim 1 wherein said first local clock signal, said intermediate local clock signal(s), and said end local clock signal overlap in such a way that two or more of said first, intermediate, or end local clock signals overlap in their evaluate phase at any point in time.

3. The IC of claim 1 wherein said dynamic logic gate has one gate delay per clock phase.

4. The IC of claim 1 wherein said dynamic logic gate comprises a clocked precharge logic gate.

5. A system that uses an integrated circuit (IC) with synchronized logic, comprising:
    a global clock signal with a global phase and an approximately 50% duty cycle;
    a first local clock signal with a first phase and an approximately 50% duty cycle that couples to a first dynamic logic gate, said first local clock signal is generated from said global clock signal;
    one or more intermediate local clock signals with one or more intermediate phases, each said intermediate local clock signal with an approximately 50% duty cycle that couple to one or more intermediate dynamic logic gates, said intermediate local clock signals are generated from said global clock signal;
    an end local clock signal with an end phase and an approximately 50% duty cycle that couples to an end dynamic logic gate, said end local clock signal is generated from said global clock signal;
    the phase of an individual local clock signal overlaps an earlier phase local clock signal by an amount approximately equal to the overlap of the phase of the next individual local clock signal; and said first dynamic logic gate, intermediate dynamic logic gate(s), and last dynamic logic gates couple such that an individual dynamic logic gate with said individual local clock signal and phase may only provide a signal to the next individual dynamic logic gate that uses a next phase local clock signal wherein the gates may couple together in series, in a feed back loop, or a feed forward loop, and said first, intermediate, or end dynamic logic gates couple to each other or to other dynamic logic gates without additional buffers, registers, latches, or static circuits.

6. The system of claim 5 wherein said first local clock signal, said intermediate local clock signal(s), and said end local clock signal overlap in such a way that two or more of said first, intermediate, or end local clock signals overlap in their evaluate phase at any point in time.

7. The system of claim 5 wherein said dynamic logic gate has one gate delay per clock phase.

8. The system of claim 5 wherein said dynamic logic gate comprises a clocked precharge logic gate.

9. A method that uses an integrated circuit (IC) with synchronized logic, comprising:

providing a global clock signal with a global phase and an approximately 50% duty cycle;

generating a first local clock signal from said global clock signal, said first local clock signal with a first phase and an approximately 50% duty cycle that couples to a first dynamic logic gate;

generating one or more intermediate local clock signals with one or more intermediate phases from said global clock signal, each said intermediate local clock signal with an approximately 50% duty cycle that couple to one or more intermediate dynamic logic gates;

generating an end local clock signal from said global clock signal, said end local clock signal with an end phase and an approximately 50% duty cycle that couples to an end dynamic logic gate;

the phase of an individual local clock signal overlaps an earlier phase local clock signal by an amount approximately equal to the overlap of the phase of the next individual local clock signal; and said first dynamic logic gate, intermediate dynamic logic gate(s), and last dynamic logic gates couple such that an individual dynamic logic gate with said individual local clock signal and phase may only provide a signal to the next individual dynamic logic gate that uses a next phase local clock signal wherein the gates may couple together in series, in a feed back loop, or a feed forward loop, and said first, intermediate, or end dynamic logic gates couple to each other or to other dynamic logic gates without additional buffers, registers, latches, or static circuits.

10. The method of claim 9 wherein said first local clock signal, said intermediate local clock signal(s), and said end local clock signal overlap in such a way that two or more of said first, intermediate, or end local clock signals overlap in their evaluate phase at any point in time.

11. The method of claim 9 wherein said dynamic logic gate has one gate delay per clock phase.

12. The method of claim 9 wherein said dynamic logic gate comprises a clocked precharge logic gate.

13. A method to manufacture an integrated circuit (IC) with synchronized logic, comprising:

providing a global clock signal with a global phase and an approximately 50% duty cycle;

providing a first local clock signal with a first phase and an approximately 50% duty cycle, said first local clock signal is generated from said global clock signal;

coupling said first local clock signal to a first dynamic logic gate;

providing one or more intermediate local clock signals with one or more intermediate phases, each said intermediate local clock signal with an approximately 50% duty cycle, said intermediate local clock signals are generated from said global clock signal;

coupling said one or more intermediate local clock signals to one or more intermediate dynamic logic gates;

providing an end local clock signal with an end phase and an approximately 50% duty cycle, said end local clock signal is generated from said global clock signal;

coupling said end local clock signal to an end dynamic logic gate;

the phase of an individual local clock signal overlaps an earlier phase local clock signal by an amount approximately equal to the overlap of the phase of the next individual local clock signal; and said first dynamic logic gate, intermediate dynamic logic gate(s), and last dynamic logic gates couple such that an individual dynamic logic gate with said individual local clock signal and phase may only provide a signal to the next individual dynamic logic gate that uses a next phase local clock signal wherein the gates may couple together in series, in a feed back loop, or a feed forward loop, and said first, intermediate, or end dynamic logic gates couple to each other or to other dynamic logic gates without additional buffers, registers, latches, or static circuits.

14. The method of claim 13 wherein said first local clock signal, said intermediate local clock signal(s), and said end local clock signal overlap in such a way that two or more of said first, intermediate, or end local clock signals overlap in their evaluate phase at any point in time.

15. The method of claim 13 wherein said dynamic logic gate has one gate delay per clock phase.

16. The method of claim 13 wherein said dynamic logic gate comprises a clocked precharge logic gate.

* * * * *